(12) United States Patent
Kishino

(10) Patent No.: US 9,978,927 B2
(45) Date of Patent: May 22, 2018

(54) ACOUSTIC WAVE ELEMENT, DUPLEXER AND COMMUNICATION DEVICE

(71) Applicant: Kyocera Corporation, Kyoto-shi, Kyoto (JP)

(72) Inventor: Tetsuya Kishino, Kyoto (JP)

(73) Assignee: KYOCERA Corporation, Kyoto (JP)

( * ) Notice: Subject to any disclaimer, the term of this patent is extended or adjusted under 35 U.S.C. 154(b) by 190 days.

(21) Appl. No.: 15/039,810

(22) PCT Filed: Nov. 29, 2014

(86) PCT No.: PCT/JP2014/081662
§ 371 (c)(1),
(2) Date: May 26, 2016

(87) PCT Pub. No.: WO2015/080278
PCT Pub. Date: Jun. 4, 2015

(65) Prior Publication Data
US 2016/0380176 A1 Dec. 29, 2016

(30) Foreign Application Priority Data

Nov. 26, 2013 (JP) ................................ 2013-268194
Nov. 29, 2013 (JP) ................................ 2013-247163

(51) Int. Cl.
*H03H 9/25* (2006.01)
*H03H 9/64* (2006.01)
(Continued)

(52) U.S. Cl.
CPC ....... *H01L 41/047* (2013.01); *H03H 9/14517* (2013.01); *H03H 9/25* (2013.01);
(Continued)

(58) Field of Classification Search
CPC ...... H03H 9/25; H03H 9/64; H03H 9/72–9/76
(Continued)

(56) References Cited

U.S. PATENT DOCUMENTS 6,583,691 B2 * 6/2003 Takamine .......... H03H 9/14582
 310/313 D
6,946,932 B2 * 9/2005 Takagi ............... H03H 9/02551
 310/10

(Continued)

FOREIGN PATENT DOCUMENTS

JP H03-139008 A 6/1991
JP H06-260876 A 9/1994
(Continued)

OTHER PUBLICATIONS

International Search Report dated Feb. 10, 2015 and Written Opinion of the International Searching Authority issued by Japan Patent Office for International Application No. PCT/JP2014/081662.

*Primary Examiner* — Dean Takaoka
*Assistant Examiner* — Alan Wong
(74) *Attorney, Agent, or Firm* — Procopio Cory Hargreaves and Savitch LLP

(57) ABSTRACT

An elastic wave element has a piezoelectric substrate; an excitation electrode which is located on an upper surface of the piezoelectric substrate and generates an acoustic wave, and two reflectors which are located on the upper surface of the piezoelectric substrate and sandwich the excitation electrode in the propagation direction of the acoustic wave. The excitation electrode has a main region located between the two end parts of the propagation direction and outer regions located on two sides of the main region. When the number of the electrode fingers of the outer region is "m", an electrode finger interval of the main region is "a", and an interval between the electrode finger of the main region on the outer region side and the reflector electrode finger of the reflector is "x", 0.5×a×(m+1)<x<a×(m+1) is satisfied. Further, a resonant frequency of the reflector is lower than a (Continued)

resonant frequency in the main region of the excitation electrode.

16 Claims, 25 Drawing Sheets

(51) Int. Cl.
*H01L 41/047* (2006.01)
*H03H 9/145* (2006.01)
*H03H 9/72* (2006.01)
*H03H 9/00* (2006.01)

(52) U.S. Cl.
CPC .............. *H03H 9/64* (2013.01); *H03H 9/725* (2013.01); *H03H 9/0009* (2013.01); *H03H 9/0038* (2013.01)

(58) Field of Classification Search
USPC .................................................. 333/193–196
See application file for complete search history.

(56) References Cited

U.S. PATENT DOCUMENTS

| | | | | |
|---|---|---|---|---|
| 7,528,685 | B2* | 5/2009 | Tanaka | H03H 9/02551 333/193 |
| 7,679,474 | B2* | 3/2010 | Igaki | H03H 9/14544 310/313 D |
| 7,760,048 | B2* | 7/2010 | Shibahara | H03H 9/0061 333/133 |
| 8,358,177 | B2* | 1/2013 | Yamanaka | H03H 9/02551 310/313 B |
| 8,994,472 | B2* | 3/2015 | Yamaji | H03H 9/14535 333/133 |
| 2002/0036549 | A1 | 3/2002 | Matsuda et al. | |
| 2002/0175783 | A1 | 11/2002 | Watanabe et al. | |
| 2009/0021108 | A1 | 1/2009 | Owaki et al. | |
| 2009/0108960 | A1 | 4/2009 | Igaki et al. | |
| 2011/0199160 | A1 | 8/2011 | Yamanaka | |
| 2011/0199163 | A1 | 8/2011 | Yamanaka | |
| 2011/0204984 | A1 | 8/2011 | Yamanaka | |

FOREIGN PATENT DOCUMENTS

| | | |
|---|---|---|
| JP | 2002-111442 | 4/2002 |
| JP | 2003-008390 A | 1/2003 |
| JP | 2004-363641 A | 12/2004 |
| JP | 2007-013414 A | 1/2007 |
| JP | 2007-214902 A | 8/2007 |
| JP | 2010-273382 A | 12/2010 |
| WO | 2006-137464 A1 | 12/2006 |
| WO | 2010-047112 A1 | 4/2010 |
| WO | 2010-047113 A1 | 4/2010 |
| WO | 2010-047114 A1 | 4/2010 |

* cited by examiner

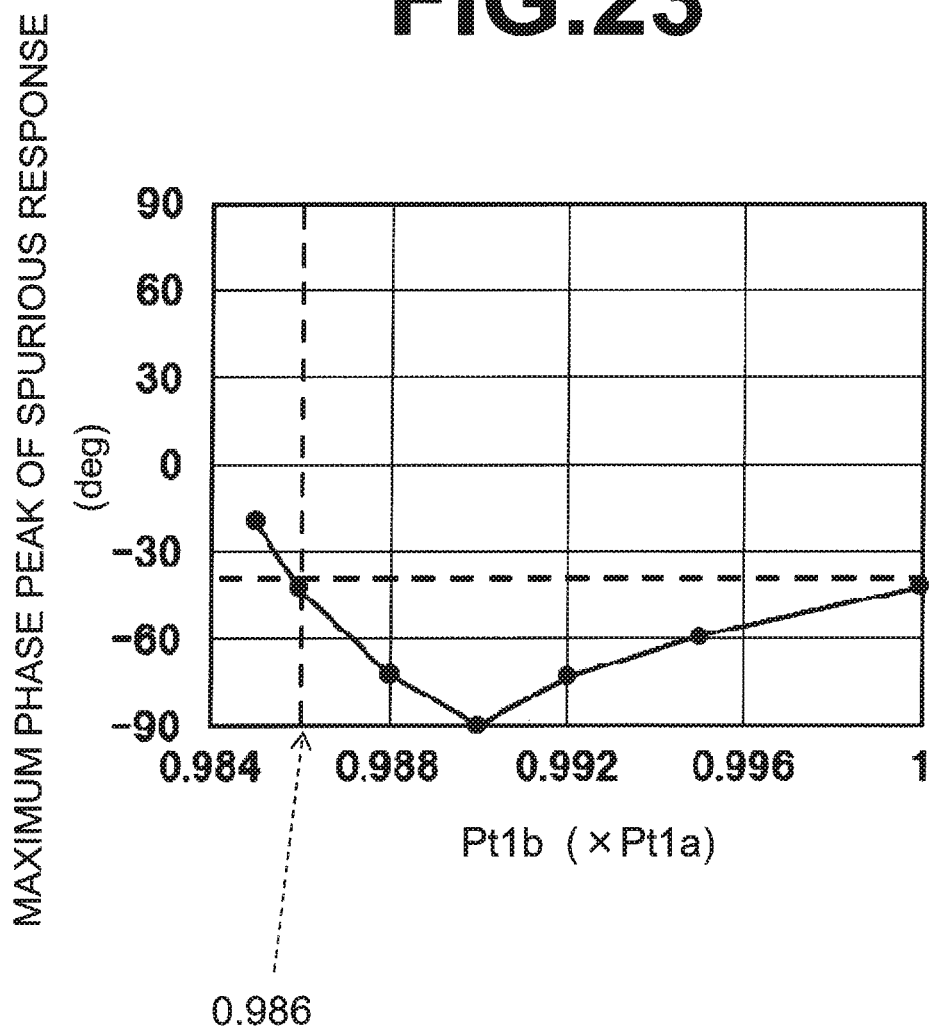

ACOUSTIC WAVE ELEMENT, DUPLEXER AND COMMUNICATION DEVICE

TECHNICAL FIELD

The present invention relates to an acoustic wave element, a duplexer and a communication device.

BACKGROUND ART

In recent years, in a communication device such as a mobile terminal, use is made of an acoustic wave element for a duplexer for filtering signals which are transmitted to and received from an antenna. Such an acoustic wave element is configured by a piezoelectric substrate and an excitation electrode formed on a major surface of the piezoelectric substrate. The acoustic wave element utilizes the characteristic feature that an electrical signal and a surface acoustic wave can be converted to each other by the relationship between the excitation electrode and the piezoelectric substrate.

A duplexer uses a plurality of such acoustic wave elements to configure for example a receiving filter (Rx filter) or transmission filter (see Japanese Patent Publication No. 2007-214902A etc.). In the duplexer, the plurality of acoustic wave elements are used to set a passband of the reception band or transmission band.

SUMMARY OF INVENTION

Technical Problem

In such a duplexer, improvement of the characteristic features in the passband of the reception band or transmission band is one of the pending issues.

Therefore, the present invention was made in consideration of such circumstances and has as an object thereof to provide an acoustic wave element, a duplexer, and a communication device capable of improving the characteristic features in the passband of signals.

Solution to Problem

An acoustic wave element according to one embodiment of the present invention has a piezoelectric substrate, an excitation electrode, and reflectors. The excitation electrode is located on an upper surface of the piezoelectric substrate, has a plurality of electrode fingers, and generates an acoustic wave. The reflectors are located on the upper surface of the piezoelectric substrate and have pluralities of reflector electrode fingers. These reflectors are arranged so as to sandwich the excitation electrode in the propagation direction of the acoustic wave. The excitation electrode has a main region which is located between the two end parts in the propagation direction of the acoustic wave and is uniform in electrode finger design of the electrode fingers and two outer regions which are located on the two sides sandwiching the main region therebetween and run from part modified in electrode finger design from that of the main region up to the end parts. In the reflector, a resonant frequency, which is determined according to the electrode finger design of the reflector electrode fingers, becomes lower than the resonant frequency determined according to the electrode finger design of the electrode fingers of the main region in the excitation electrode. Further, $0.5 \times a \times (m+1) < x < a \times (m+1)$ is satisfied, where an interval between the center of the electrode finger and the center of the electrode finger adjacent to the former electrode finger in the main region is "a", the number of the electrode fingers configuring the outer region is "m", and a distance between the center of the electrode finger which is located on the side nearest the outer region among the electrode fingers of the main region and the center of the reflector electrode finger which is located on the side nearest the outer region among the reflector electrode fingers of the reflector is "x".

A duplexer according to one embodiment of the present invention is a duplexer having an antenna terminal, a transmission filter which filters a transmission signal and outputs the result to the antenna terminal, and a receiving filter which filters a reception signal from the antenna terminal. The transmission filter or the receiving filter has the acoustic wave element explained above.

A communication device according to one embodiment of the present invention has an antenna, the duplexer explained above which is electrically connected to the antenna, and an RF-IC which is electrically connected to the duplexer.

Advantageous Effects of Invention

According to the acoustic wave element, duplexer, and communication device of the present invention, the characteristic features in the passband of a signal can be improved.

BRIEF DESCRIPTION OF DRAWINGS

FIG. 7B is an enlargement of a portion in FIG. 7A.

FIGS. 10A and 1B show results of simulation of an acoustic wave element according to Comparative Example 2, where

FIG. 11B is an enlargement of a portion in FIG. 11A.

FIG. 20B is an enlargement of a portion in FIG. 20A.

FIG. 21B is an enlargement of a portion in FIG. 21A.

FIG. 22B is an enlargement of a portion in FIG. 22A.

FIG. 23 shows results of simulation of the acoustic wave element according to Example 3.

DESCRIPTION OF EMBODIMENTS

Below, an acoustic wave element, a duplexer, and a communication device according to embodiments of the present invention will be explained with reference to the drawings. Note that, the diagrams used in the following explanation are schematic ones. Proportions etc. on the drawings do not always match the actual ones.

In an acoustic wave element, any direction may be defined as "upward" or "downward". In the following description, for convenience, an orthogonal coordinate system xyz will be defined, and an "upper surface", "lower surface", and another terms will be used where the positive side of the z-direction is the upper part.

<Summary of Configuration of Acoustic Wave Element>

Figure 1:
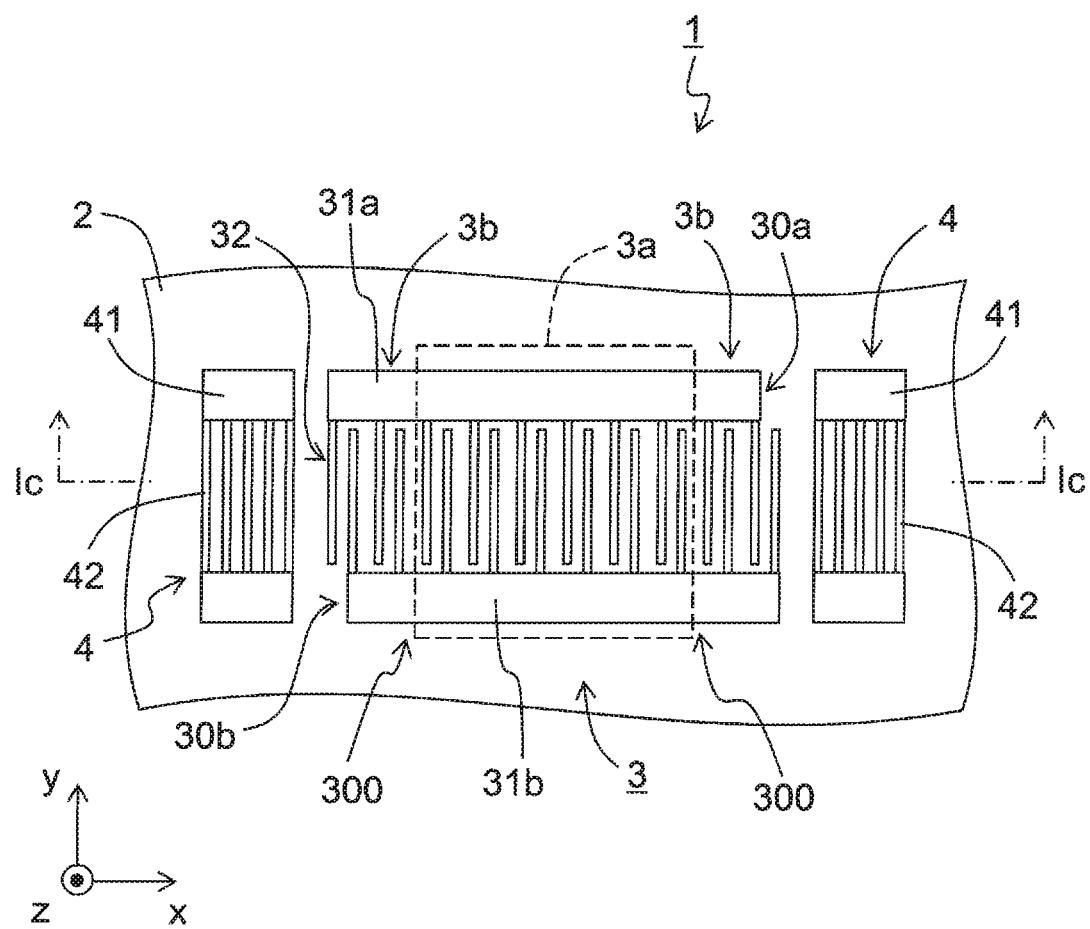
FIG. 1 is a plan view showing the configuration of an acoustic wave element according to an embodiment of the present invention.
Figure 2:
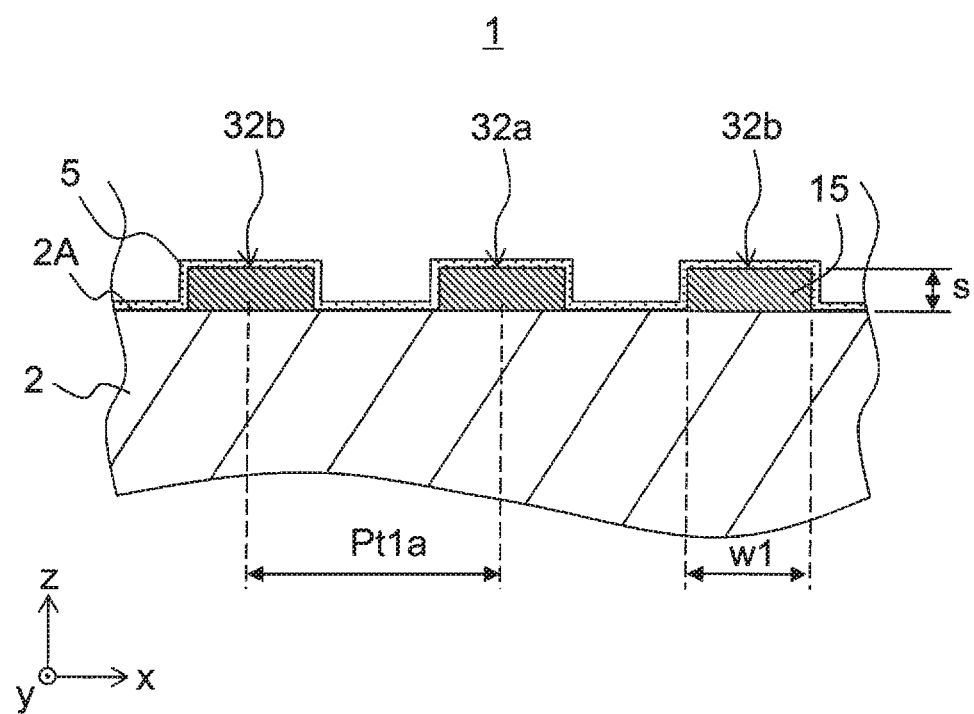
FIG. 2 corresponds to a cross-section of a portion cut along the Ic-Ic line in the acoustic wave element in FIG. 1.

FIG. 1 is a plan view showing the configuration of an acoustic wave (SAW: surface acoustic wave) element 1 according to an embodiment of the present invention. FIG. 2 is a cross-sectional view of a portion taken along the Ic-Ic cut line in FIG. 1. The SAW element 1, as shown in FIG. 1, has a piezoelectric substrate 2, and an excitation electrode (IDT (InterDigital Transducer) electrode) 3, and reflectors 4 which are provided on an upper surface 2A of the piezoelectric substrate 2.

The SAW element 1 can be improved in the characteristic features of the passband of signals by the electrode finger design of the two outer regions 3b in the IDT electrode 3 which are located on the reflector 4 sides and by the electrode finger design of the reflectors 4. Below, these components will be explained in detail.

The piezoelectric substrate 2 is configured by a substrate of single crystal having piezoelectricity made of lithium niobate ($LiNbO_3$) crystal or lithium tantalate ($LiTaO_3$) crystal. Specifically, for example, the piezoelectric substrate 2 is configured by a 36° to 48° Y-X cut $LiTaO_3$ substrate. The planar shape and various dimensions of the piezoelectric substrate 2 may be suitably set. As an example, the thickness (z-direction) of the piezoelectric substrate 2 is 0.2 mm to 0.5 mm.

The IDT electrode 3, as shown in FIG. 1, has a first comb-shaped electrode 30a and second comb-shaped electrode 30b. Note that, in the following explanation, the first comb-shaped electrode 30a and second comb-shaped electrode 30b will be sometimes simply referred to as the "comb-shaped electrodes 30" and not differentiated.

The comb-shaped electrodes 30, as shown in FIG. 1, have two bus bars 31 facing each other and pluralities of electrode fingers 32 which extend from the bus bars 31 toward the other bus bar 31 sides. Further, the pair of comb-shaped electrodes 30 are arranged so that their first electrode fingers 32a and second electrode fingers 32b mesh (intersect) with each other in the propagation direction of the acoustic wave. Note that, dummy electrodes facing the electrode fingers 32 may be arranged at the bus bars 31 as well. The present embodiment shows a case where dummy electrodes are not provided.

The acoustic wave is generated and propagated in the direction perpendicular to the pluralities of electrode fingers 32. Accordingly, after considering the crystal orientation of the piezoelectric substrate 2, the two bus bars 31 are arranged so as to face each other in a direction crossing the direction in which the acoustic wave is to be propagated. The pluralities of electrode fingers 32 are formed so as to extend in the direction perpendicular to the direction in which the acoustic wave is to be propagated. Note that, the propagation direction of the acoustic wave is determined according to the orientations etc. of the plurality of electrode fingers 32. In the present embodiment, however, for convenience, the orientations etc. of the plurality of electrode fingers 32 will be sometimes explained using the propagation direction of the acoustic wave as the standard.

The bus bars 31 are for example formed in long shapes so as to linearly extend with roughly constant widths. Accordingly, edge parts of the bus bars 31 on the sides facing each other are linear in shape. The pluralities of electrode fingers 32 are for example formed in long shapes so as to linearly extend with roughly constant widths and are arranged in the propagation direction of the acoustic wave at roughly constant intervals.

Figure 3:
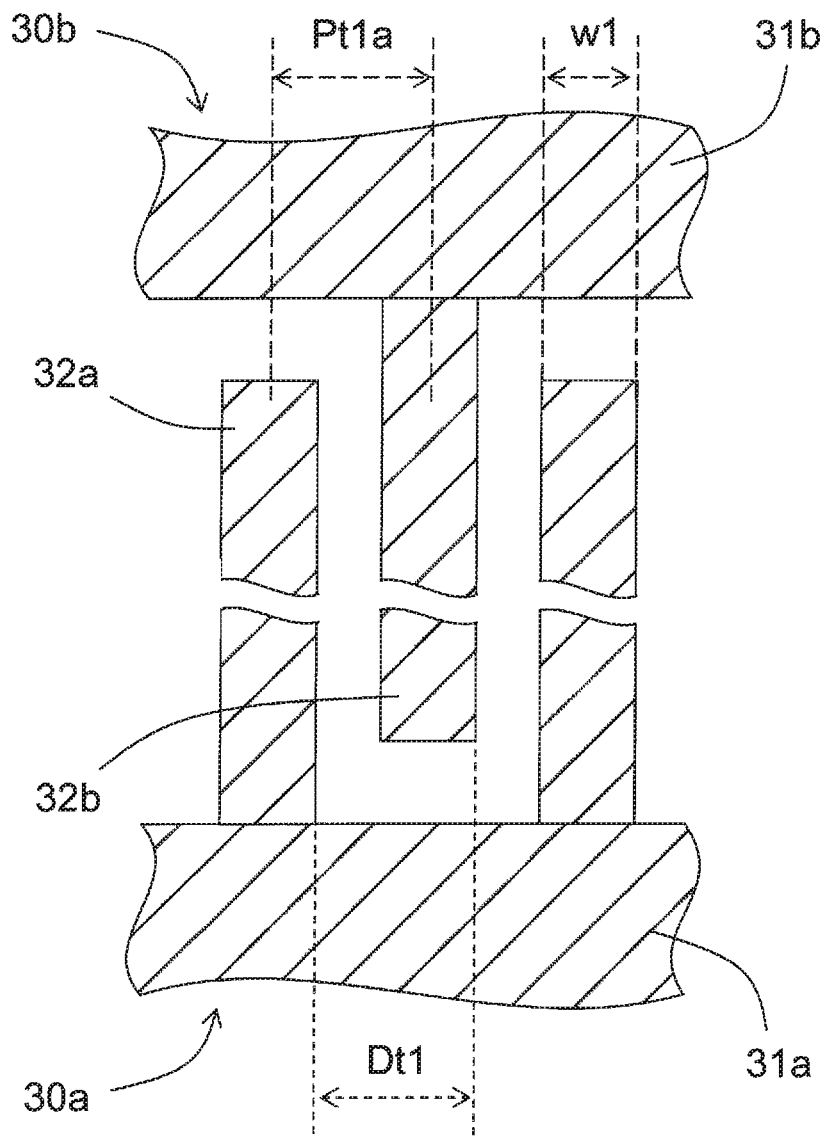
FIG. 3 is an enlarged plan view enlarging a portion of an IDT electrode in the acoustic wave element in FIG. 1.

In the IDT electrode 3, as shown in FIG. 1, in the propagation direction of the acoustic wave, a main region 3a which is arranged between the two ends and two outer regions 3b from the two ends up to the main region 3a are set. The plurality of electrode fingers 32 of the pair of comb-shaped electrodes 30 configuring the main region 3a of the IDT electrode 3 are set so that the intervals between the centers of widths of the adjoining electrode fingers 32 become a first pitch Pt1a. The first pitch Pt1a is, in the main region 3a, for example, set so as to become equal to a half wavelength of a wavelength λ of the acoustic wave at the frequency at which resonation is desired to be caused. The wavelength λ (2×Pt1a) is for example 1.5 μm to 6 μm. Here, the first pitch Pt1a, as shown in FIG. 3, indicates the interval from the center of the width of the first electrode finger 32a to the center of the width of the second electrode finger 32b which is adjacent to the above first electrode finger 32a in the propagation direction of the acoustic wave. Hereinafter, when explaining the pitch, the term "center of width of the electrode finger 32" will be sometimes simply explained as the "center of the electrode finger 32".

In each electrode finger 32, a width w1 in the propagation direction of the acoustic wave is suitably set in accordance with the electrical characteristics etc. which are demanded from the SAW element 1. The width w1 of the electrode finger 32 is for example range from 0.3 times or more to 0.7 times or less to the first pitch Pt1a.

The lengths of the plurality of electrode fingers 32 (lengths from the bus bars 31 to the front ends) are for example set to roughly the same lengths. Note that, the length of each electrode finger 32 may be modified as well. For example, the length may be made longer or shorter toward the propagation direction of the acoustic wave as well. Specifically, an apodize type IDT electrode 3 may be configured by changing the length of each electrode finger 32 with respect to the propagation direction as well. In this case, a spurious response of the transverse mode can be reduced and the power handling property can be improved.

The IDT electrode 3 is for example configured by a conductive layer 15 made of metal. As this metal, for example, there can be mentioned Al or an alloy containing Al as a principal ingredient (Al alloy). The Al alloy is for example Al—Cu alloy. Note that, the IDT electrode 3 may be configured by a plurality of metal layers as well. Various dimensions of the IDT electrode 3 are suitably set in accordance with the electrical characteristics etc. which are requested to the SAW element 1. The thickness (z-direction) of the IDT electrode 3 is for example 50 nm to 600 nm.

The IDT electrode 3 may be directly arranged on the upper surface 2A of the piezoelectric substrate 2 or may be arranged on the upper surface 2A of the piezoelectric substrate 2 through another member. This other member is for example comprised of Ti, Cr, or an alloy of the same. When the IDT electrode 3 is arranged on the upper surface 2A of the piezoelectric substrate 2 through another member, this other member is set to a thickness of an extent where almost no influence is exerted on the electrical characteristics of the IDT electrode 3 (for example a thickness of 5% of the thickness of the IDT electrode 3 in the case where another member is made of Ti).

Further, on the electrode fingers 32 configuring the IDT electrode 3, a mass-adding film may be laminated as well in order to improve the temperature characteristic of the SAW element 1. As the mass-adding film, use can be made of for example $SiO_2$ or the like.

The IDT electrode 3 excites an acoustic wave which is propagated in the x-direction near the upper surface 2A of the piezoelectric substrate 2 when a voltage is applied. The excited acoustic wave is reflected at a boundary between the electrode fingers 32 and a region where it is not arranged (a long region between adjoining electrode fingers 32). Further, a standing wave having the first pitch Pt1a of the electrode finger 32 in the main region 3a as a half wavelength is formed. The standing wave is converted to an electrical signal having the same frequency as that of the standing wave and is extracted by the electrode fingers 32. In this way, the SAW element 1 functions as the 1-port resonator.

Each reflector 4 is formed so that the spaces among the plurality of reflector electrode fingers 42 form slit shapes. That is, the reflector 4 has reflector bus bars 41 which face each other in a direction crossing the propagation direction of the acoustic wave and a plurality of reflector electrode fingers 42 which extend in the direction perpendicular to the propagation direction of the acoustic wave so as to connect the bus bars 41 with each other between these bus bars 41. The reflector bus bars 41 are for example formed in long shapes so as to linearly extend with roughly constant widths and are arranged parallel to the propagation direction of the acoustic wave. The interval between the adjoining reflector bus bars 41 for example can be set roughly the same as the interval between the adjoining bus bars 31 of the IDT electrode 3.

Figure 4:
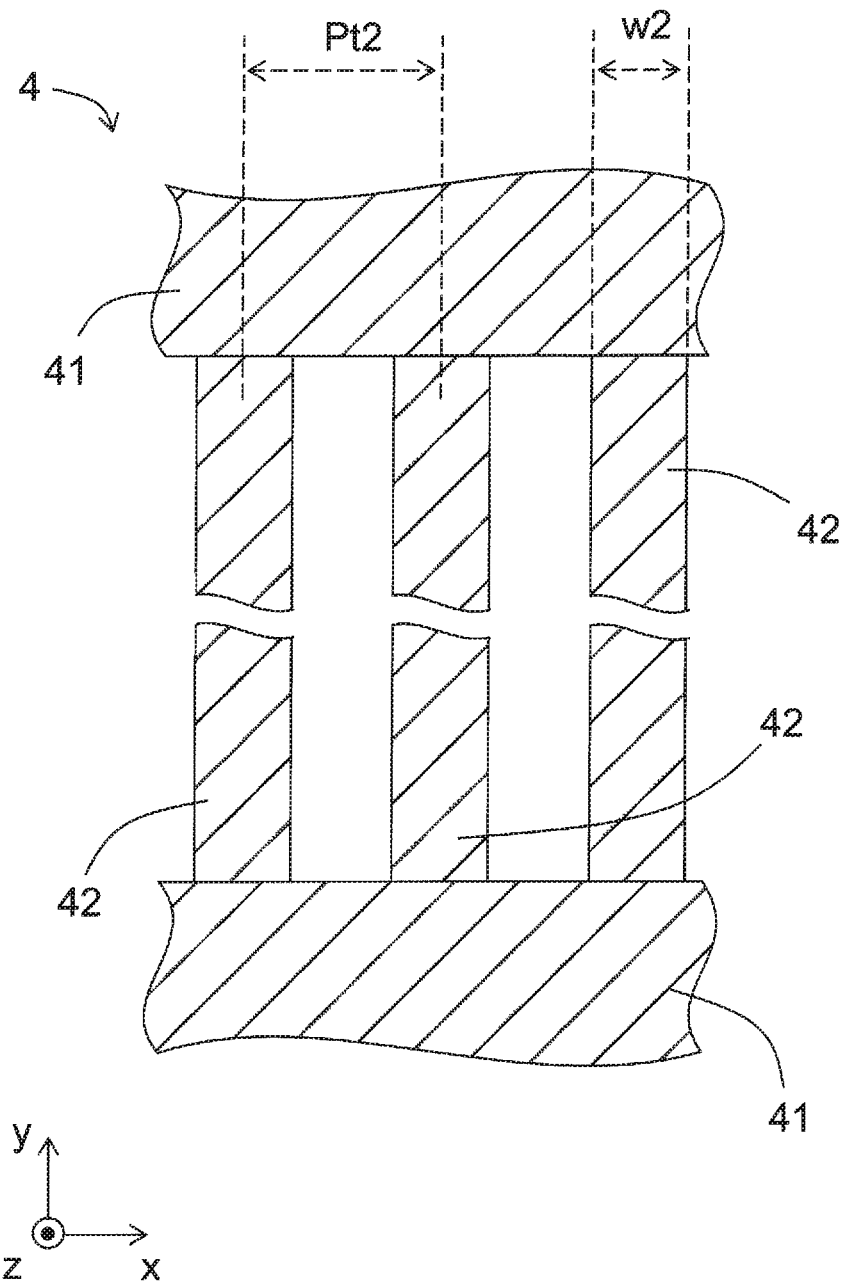
FIG. 4 is an enlarged plan view enlarging a portion of a reflector in the acoustic wave element in FIG. 1.

The plurality of reflector electrode fingers 42 are arranged with a pitch Pt2 which is for reflecting the acoustic wave excited in the IDT electrode 3. The pitch Pt2 will be explained later. Here, the pitch Pt2, as shown in FIG. 4, indicates the interval between the center of a reflector electrode finger 42 and the center of a reflector electrode finger 42 which is adjacent to it in the propagation direction.

Further, the plurality of reflector electrode fingers 42 are formed in long shapes so as to linearly extend with roughly constant widths. The width w2 of the reflector electrode fingers 42 can be set for example to be substantially the same as the width w1 of the electrode fingers 32. The reflectors 4 are for example formed by the same material as that for the IDT electrode 3 and are formed to thicknesses equal to that of the IDT electrode 3.

The protective layer 5, as shown in FIG. 3, is provided on the piezoelectric substrate 2 so as to cover the tops of the IDT electrode 3 and reflectors 4. Specifically, the protective layer 5 covers the surfaces of the IDT electrode 3 and reflectors 4 and covers portions in the upper surface 2A which are exposed from the IDT electrode 3 and reflectors 4. The thickness of the protective layer 5 is for example 1 nm to 50 nm.

The protective layer 5 is made of a material having an insulation property and contributes to protection of the IDT electrode 3 and reflectors 4 from corrosion etc. Preferably, the protective layer 5 is formed by a material such as $SiO_2$ or the like, in which the speed of propagation of the acoustic wave becomes fast when the temperature rises. Due to this, a change of the electrical characteristics coursed by a change of the temperature of the acoustic wave element 1 can be suppressed as well.

In the SAW element 1 having such a configuration, the electrode finger design of the outer regions 3b which are located on the sides nearer the end parts from the main region 3a and the electrode finger design of the reflectors 4 are set in the following way.

(1) Regarding Outer Regions 3b of IDT Electrode 3

The IDT electrode 3 includes the main region 3a and outer regions 3b. The electrode finger design of the main region 3a is uniform. That electrode finger design determines the excitation frequency of the entire IDT electrode 3. That is, the electrode fingers are designed so that design parameters of the electrode fingers 32 such as the pitch, width, thickness and so on are made constant matching with the desired excitation frequency. The outer regions 3b indicate regions which run from the part where this uniform electrode finger design of the main region 3a is modified to the end parts. Here, the term "modified" means "changed" at least at one of the design parameters of the pitch of electrode fingers 32 (interval between the centers of the electrode fingers 32), gap (gap between the electrode fingers 32), width, and thickness. The number of the electrode fingers 32 configuring the main region 3a and the numbers of the electrode fingers 32 configuring the outer regions 3b are suitably set so that the resonant frequency according to the electrode finger design of the main region 3a determines the excitation frequency of the entire IDT electrode 3. Specifically, it is enough that the number of the electrode fingers 32 configuring the main region 3a is made larger than the numbers of the electrode fingers 32 configuring the outer regions 3b.

Figure 19:
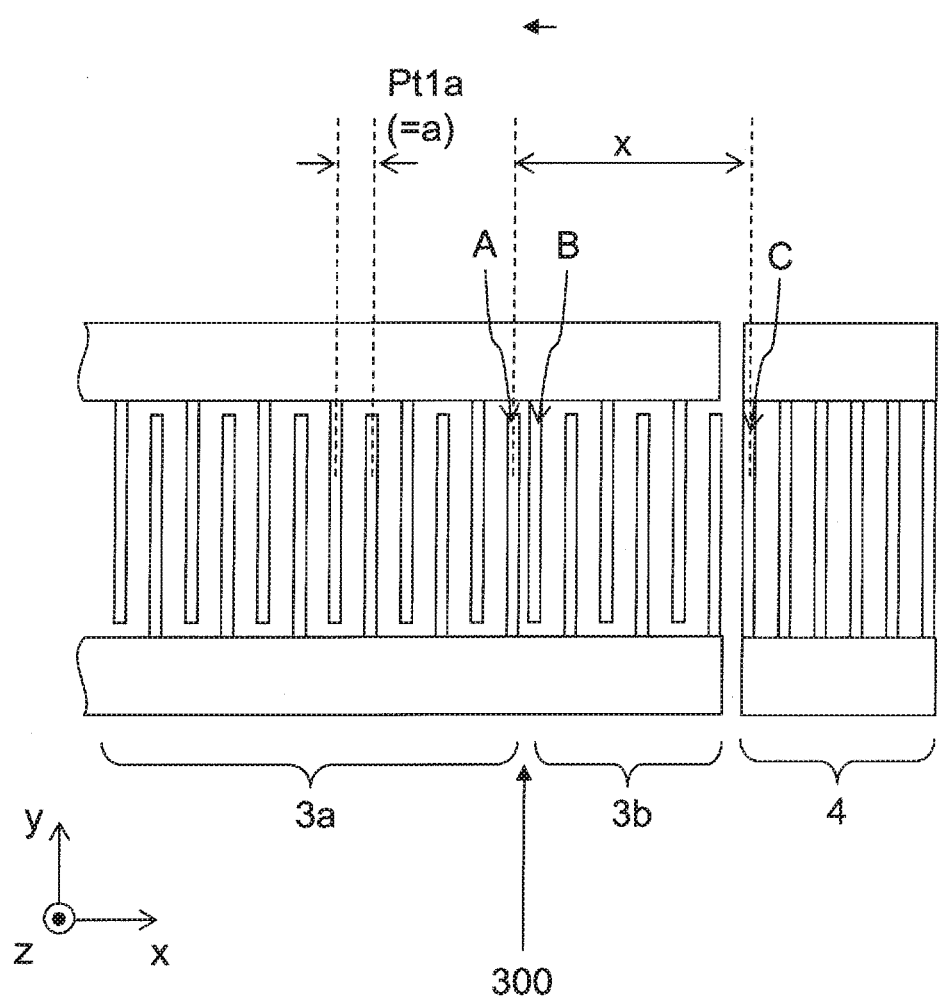
FIG. 19 is an enlarged diagram of a principal part showing a portion of an IDT electrode and reflector electrode in the acoustic wave element in FIG. 1.

FIG. 19 is an enlarged cross-sectional view of a principal part of the IDT electrode 3 and a reflector 4. Here, in the main region 3a, the electrode finger 32 which is located on the side nearest the outer region 3b will be defined as the "electrode finger A", the electrode finger 32 which is next to this and is located on the side nearest the main region 3a in the outer region 3b will be defined as the "electrode finger B", and the reflector electrode finger 42 which is located on the side nearest the IDT electrode 3 in the reflector 4 will be defined as the "reflector electrode finger C". Further, when, in the main region 3a, the interval between the center of width of the electrode finger 32 and the center of width of the electrode finger 32 next to this is defined as "a" (the first pitch Pt1a described before), the number of the electrode fingers 32 configuring the outer region 3b is defined as "m", and the distance between the center of width of the electrode finger A and the center of width of the reflector electrode finger C is "x", "x" becomes a value larger than 0.5×a×(m+1) and smaller than a×(m+1).

By configuring the device in this way, the distance between the electrode finger A and the reflector electrode finger C can be made smaller compared with a case where the outer regions 3b become uniform without modification in the electrode finger design between the main region 3a and the outer regions 3b. Due to this, the portion in which the electrode fingers 32 of the IDT electrode 3 are repeatedly arranged in the outer regions 3b (hereinafter, also referred to as the array part) can be made to more closely approach the side of the main region 3a. As a result, the boundary condition of the IDT electrode 3 generating the acoustic wave can be changed, and generation of a longitudinal mode can be suppressed.

Figure 5:
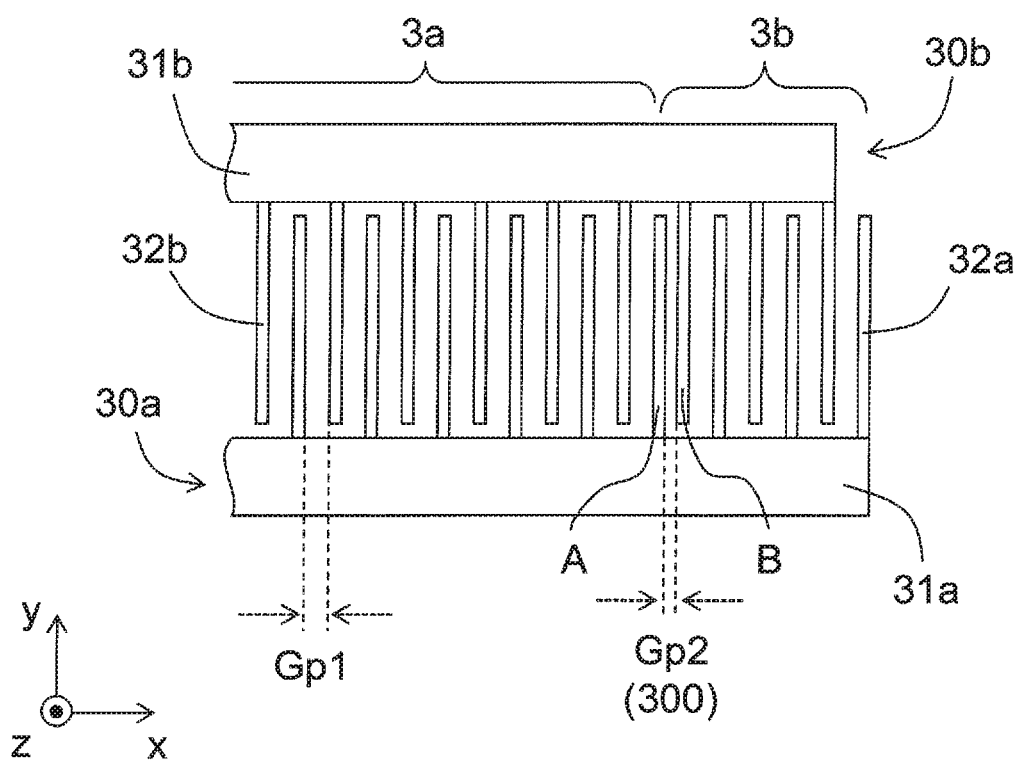
FIG. 5 is an enlarged plan view enlarging a portion of an IDT electrode in the acoustic wave element in FIG. 1.

A concrete example of changing the distance between the electrode finger A and the reflector electrode finger C satisfying the above condition will be explained next. For example, as shown in FIG. 5, by changing the gap Gp between the adjoining first electrode finger 32a and second electrode finger 32b, the distance between the electrode finger A and the reflector electrode finger C can be changed. Specifically, in order to shift the entire array part of the electrode fingers 32 in the outer region 3b relative to the main region 3a, a second gap Gp2 between the electrode finger A and the electrode finger B may be set to become narrower than the first gap Gp1 between the adjoining electrode fingers 32 in the main region 3a (first electrode finger 32a and second electrode finger 32b). This second gap Gp2 smaller than the first gap Gp1 becomes a changed part 300.

Figure 6:
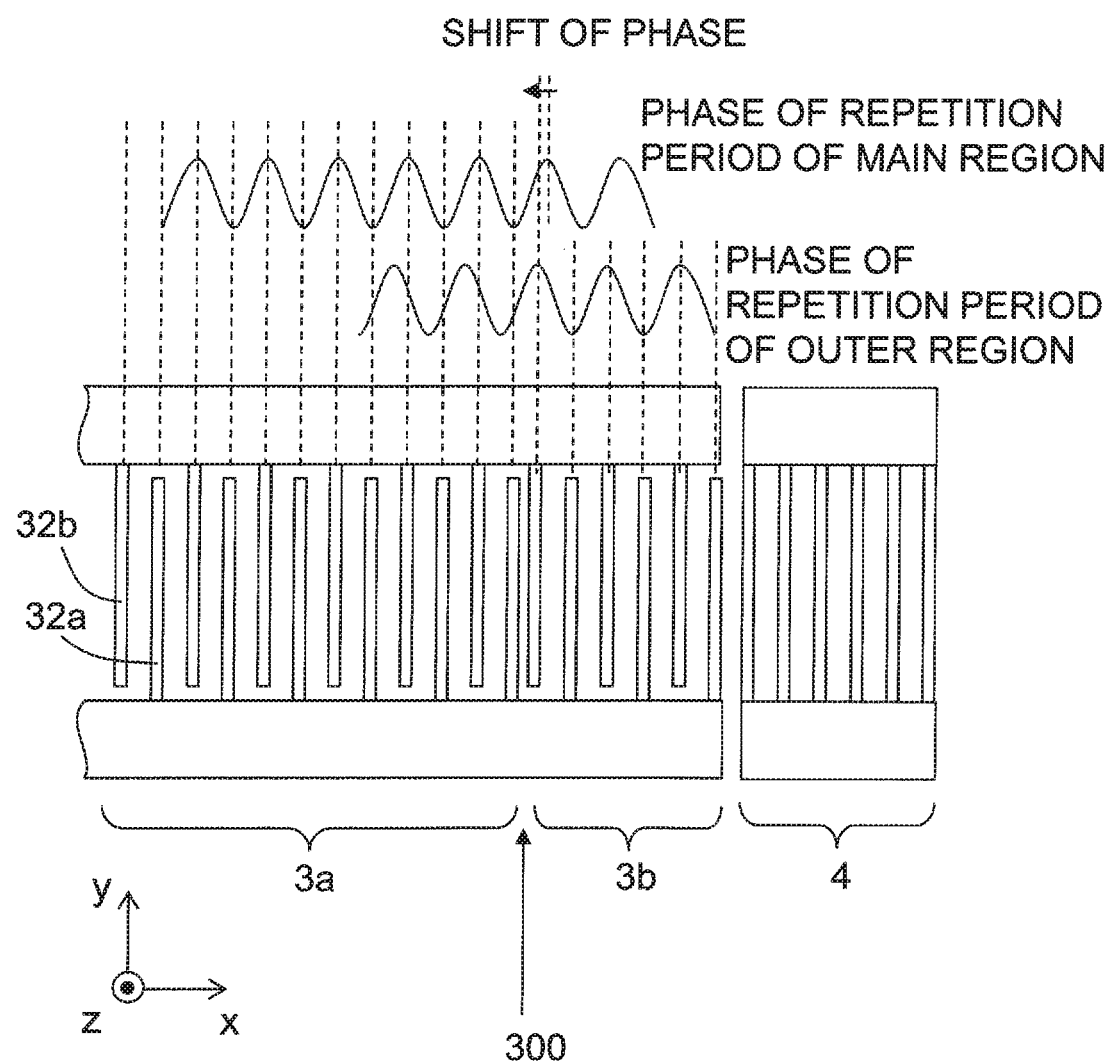
FIG. 6 schematically shows the relationships of phases of repeated array parts in a main region and outer region of acoustic wave resonation.

Here, the repeated array of the IDT electrode 3 will be studied. As shown in FIG. 6, the repeated array of the electrode fingers 32 in the IDT electrode 3 indicates for example a thing repeated with a period which is from the center of a first electrode finger 32a to the center of another first electrode finger 32a located next to it across a second electrode finger 32b. Note that, FIG. 6 shows an example set so that maximum displacements are at the center of the second electrode fingers 32b. Assume a repetition period caused by such a repeated array.

FIG. 6 shows the repeated array of the IDT electrode 3 in the main region 3a extended to the end part side while maintaining the period as it is and the repeated array of the IDT electrode 3 in the outer region 3b extended to the main region 3a side while maintaining the period as it is. Compare these two repeated arrays. The phase of the repetition period which is assumed due to the repeated array of the IDT electrode 3 in the outer region 3b is shifted to the main region 3a side compared with the phase of the repetition period which is assumed according to the repeated array of the IDT electrode 3 in the main region 3a. Due to this configuration, the boundary condition of the IDT electrode 3 generating the acoustic wave can be changed, and the generation of the longitudinal mode can be suppressed.

(II) Regarding Electrode Finger Design of Reflector

In addition to setting the positional relationship of the electrode finger A and the reflector electrode finger C described above, the resonant frequency which is determined according to the electrode finger design of a reflector 4 is set lower than the resonant frequency which is determined according to the electrode finger design of the main region 3a of the IDT electrode 3. The resonant frequency of the reflector 4 becomes higher when the pitch Pt2 is made narrower and becomes lower when the pitch Pt2 is made broader. For this reason, in order to make the resonant frequency of the reflector 4 lower than the resonant frequency of the main region 3a of the IDT electrode 3, it is enough that the pitch Pt2 of the reflector electrode fingers 42 in the reflector 4 is set to become broader than the pitch Pt (first pitch Pt1a) in the main region 3a of the IDT electrode 3.

Here, in order to confirm the effects of a SAW element of the present embodiment in which the distance between the electrode finger A and the reflector electrode finger C is changed and in which the resonant frequency of the reflector 4 is set to a predetermined value, the frequency characteristics of the SAW element were simulated. First, the conditions of simulation of a conventional SAW element shown as Comparative Example 1 are as follows.

Figure 7A:
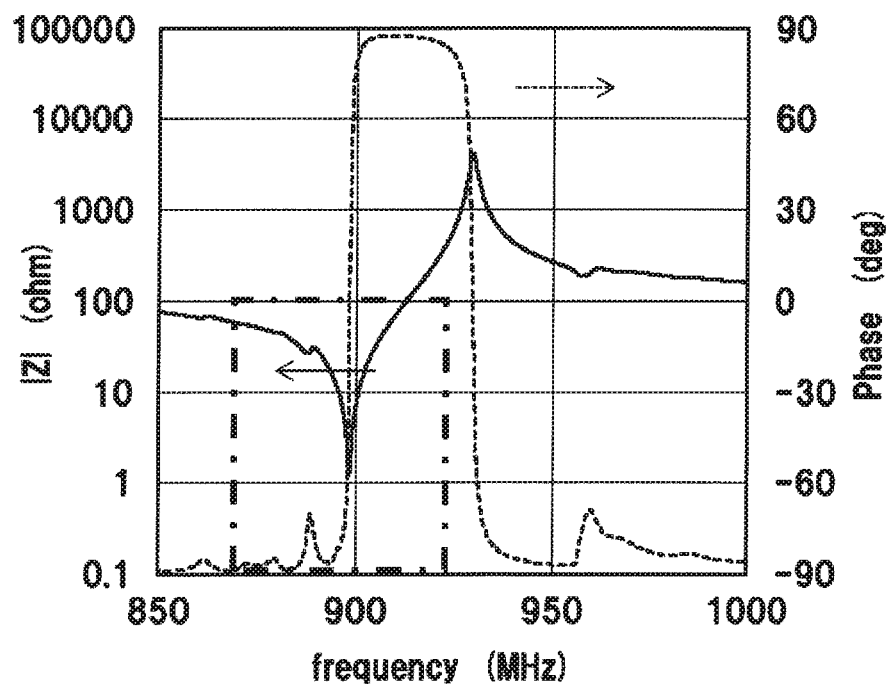
FIGS. 7A and 7B show results of simulation of an acoustic wave element according to Comparative Example 1, where
Figure 7B:
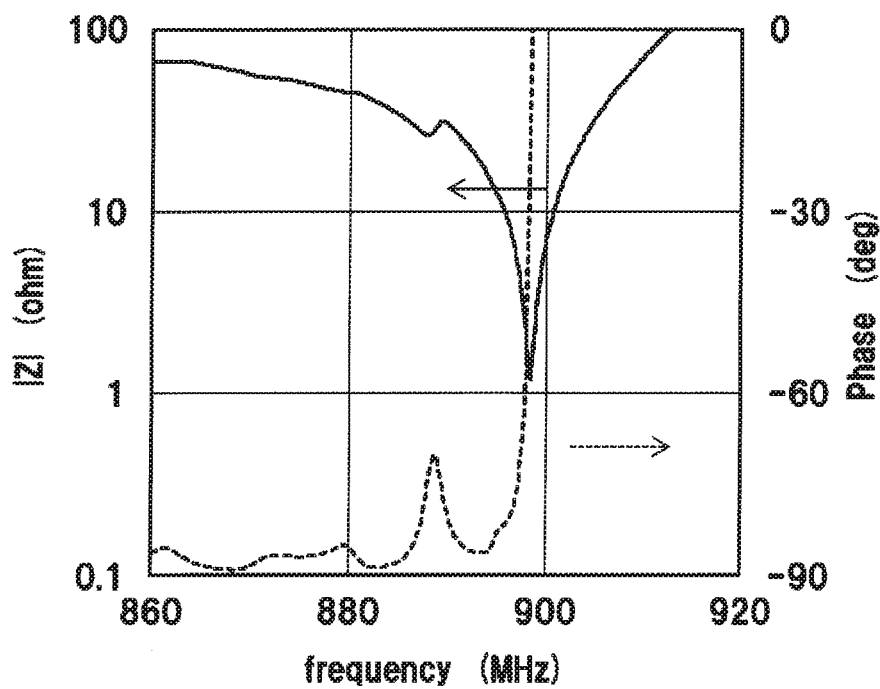

(Simulation Conditions of Comparative Example 1)
[Piezoelectric Substrate 2]
 Material: 42° Y-cut X-propagated LiTaO$_3$ substrate
[IDT Electrode 3]
 Material: Al—Cu alloy (however, there is an underlying layer of 6 nm made of Ti between the piezoelectric substrate 2 and the conductive layer 15)
 Thickness (Al—Cu alloy layer): 324 nm
 Electrode fingers 32 of IDT electrode 3:
 Number: 100
 First pitch Pt1a: 2.19 µm
 Duty (w1/Pt1): 0.5
 Crossing width W: 65.7 µm (15λ)
[Reflectors 4]
 Material: Al—Cu alloy (however, there is an underlying layer of 6 nm made of Ti between the piezoelectric substrate 2 and the conductive layer 15)
 Thickness (Al—Cu alloy layer): 324 nm
 Number of reflector electrode fingers 42: 30
 Pitch Pt2 of reflector electrode fingers 42: 2.19 µm (Pt1a×1.00)
[Protective Layer 5]
 Material: SiO$_2$
 Thickness: 15 nm The results of simulation of the SAW element in Comparative Example 1 computed under such conditions are shown in FIGS. 7A and 7B. The graphs shown in FIGS. 7A and 7B show the frequencies on the abscissas and show absolute values |Z| of the impedance or phases of impedance on the ordinates. Further, FIG. 7B is an enlargement of the portion which is surrounded by a one-dot chain line in FIG. 7A. It is seen from the results that a spurious response is generated at the frequency of approximately 890 MHz lower than the resonant frequency of about 900 MHz. One of causes of this is considered to be the thing a spurious response of the reflector mode of which vibration strength becomes large in the reflectors occurs in the SAW element.

Next, it was confirmed by simulation that the SAW element (Example 1) according to the present embodiment has advantageous effects. Below, the conditions of a SAW element (Example 1) according to the present embodiment will be shown. Note that, the following conditions show only the portions which are different from the SAW element in Comparative Example 1.

(Simulation Conditions of Example 1)
[IDT Electrode 3]
Electrode fingers 32 of IDT electrode 3:
Position of second gap Gp2: Between eighth and ninth fingers (from the end part of the IDT electrode 3)
Second gap Gp2: First gap Gp1×0.90
[Reflectors 4]
Pitch Pt2 of reflector electrode fingers 42: First pitch Pt1a×1.02

Figure 8A:
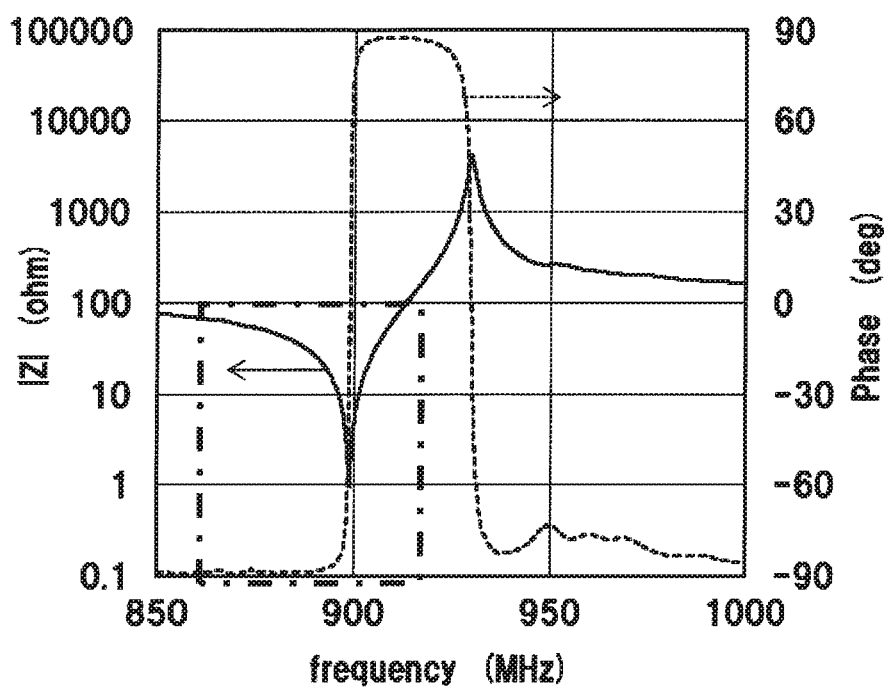
FIGS. 8A and 8B show results of simulation of an acoustic wave element according to Example 1.
Figure 8B:
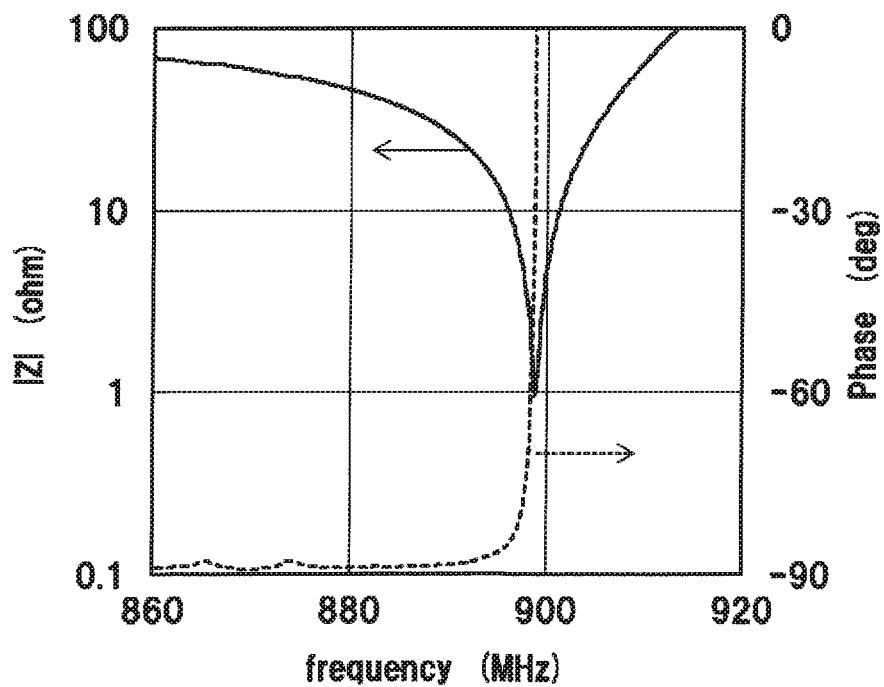

The results of simulation of the SAW element in Example 1 computed under such conditions are shown in FIGS. 8A and 8B. The graphs shown in FIGS. 8A and 8B show frequencies on the abscissas and show absolute values |Z| of impedance or phases of impedance on the ordinates. Further, FIG. 8B is an enlargement of the portion which is surrounded by a one-dot chain line in FIG. 8A.

It is seen from the results that, by the outer region 3b which is located on the side nearer the end part from the main region 3a having the changed part 300, the spurious response of the reflector mode is reduced and the spurious response of the impedance which was generated at approximately 890 MHz in Comparative Example 1 can be reduced. Note that, in this example, the outer region 3b is formed so as to include eight electrode fingers from the end part of the IDT electrode 3 and runs on up to just before the ninth electrode finger.

Next, simulation of the optimum value of the second gap Gp2 was carried out. The conditions of simulation are the same except the second gap (Gp2) in Example 1 explained above is changed. The results of this are shown in FIG. 9.

Figure 9:
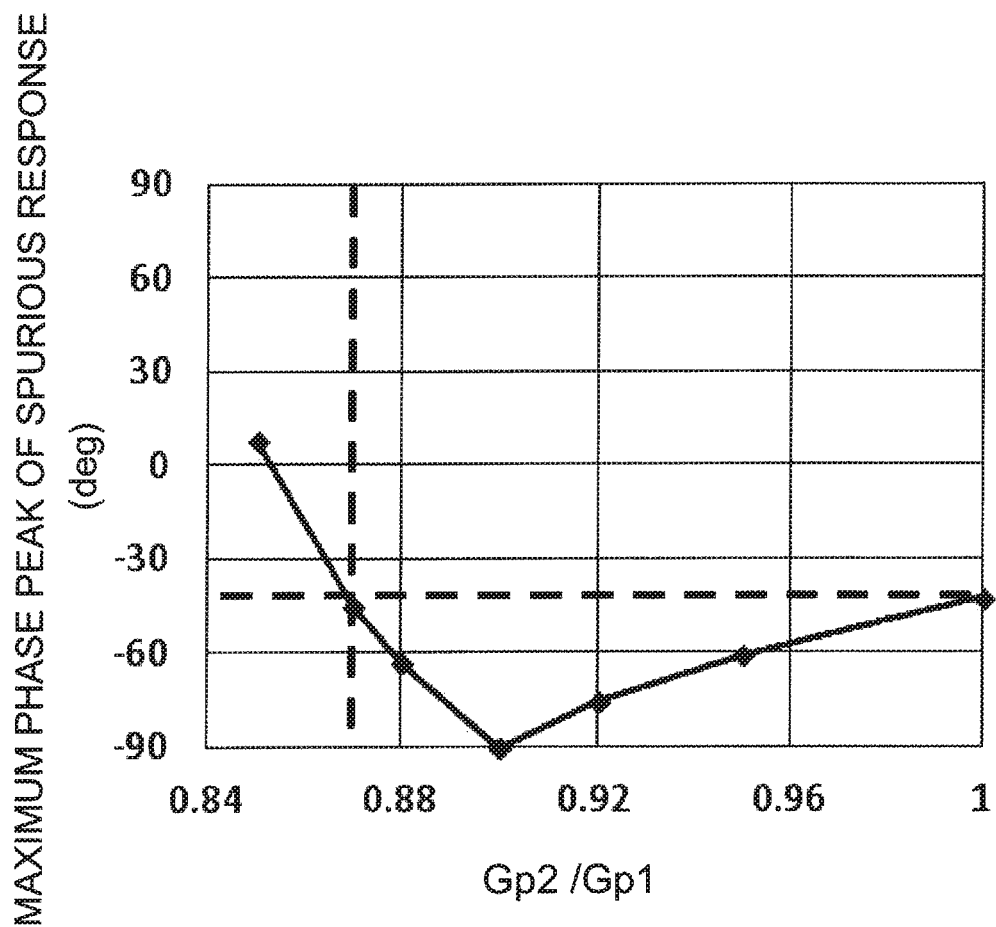
FIG. 9 shows results of simulation of an acoustic wave element according to Example 1.

In the graph shown in FIG. 9, the abscissa shows the second gap Gp2, while the ordinate shows the maximum phase peak of the spurious response in the frequency lower than the resonant frequency. Here, the maximum phase peak is the value of the phase which shows the largest spurious response out of the in the frequency lower than the resonant frequency. The larger the difference from −90 deg, the larger the spurious response. In FIG. 9, the maximum phase peak in Comparative Example 1 is indicated by a broken line which extends parallel to the abscissa. It is seen from the results shown in FIG. 9 that the above effects are exerted by setting the second gap Gp2 to be not less than 0.87×, but smaller than 1× the first gap Gp1. Further, it is seen from the results shown in FIG. 9 that the maximum phase peak of the spurious response can be substantially eliminated (corresponding to −90 deg in the results shown in FIG. 9) when the second gap Gp2 is set to be 0.90 times to the first gap Gp1, therefore the spurious response can be greatly reduced.

Further, in order to confirm the effects of the SAW element (Example 1) according to the present embodiment, simulation was carried out for (I) a case where an outer region including a changed part was provided on the side nearer the end part from the main region 3a (Comparative Example 2) and (II) a case where only the resonant frequency of the reflectors was set to the predetermined value (Comparative Example 3) with respect to Comparative Example 1. In other words, the resonant frequency of the reflectors is equal to that in the main region 3a in Comparative Example 2, and the IDT electrode 3 is of a uniform electrode finger design in Comparative Example 3. The correspondence table of Example 1 and Comparative Examples 1 to 3 is shown in Table 1.

TABLE 1

| | Second gap Gp2 | Location of phase changed part (from end part) | Pitch Pt2 (reflectors) |
|---|---|---|---|
| Comparative Example 1 | — | — | — |
| Comparative Example 2 | 0.90 times | Between eighth and ninth | — |
| Comparative Example 3 | — | — | 1.02 times |
| Example 1 | 0.90 times | Between eighth and ninth | 1.02 times |

In Table 1, the column "Second gap Gp2" indicates a multiplying factor with respect to the first gap Gp1. Specifically, in the SAW element in Comparative Example 2, the second gap Gp2 is set to be 0.90 times to the first gap Gp1. Further, in Table 1, the column "Pitch Pt2" of the reflectors 4 indicates the multiplying factor with respect to the first pitch Pt1a of the IDT electrode 3.

Figure 10A:
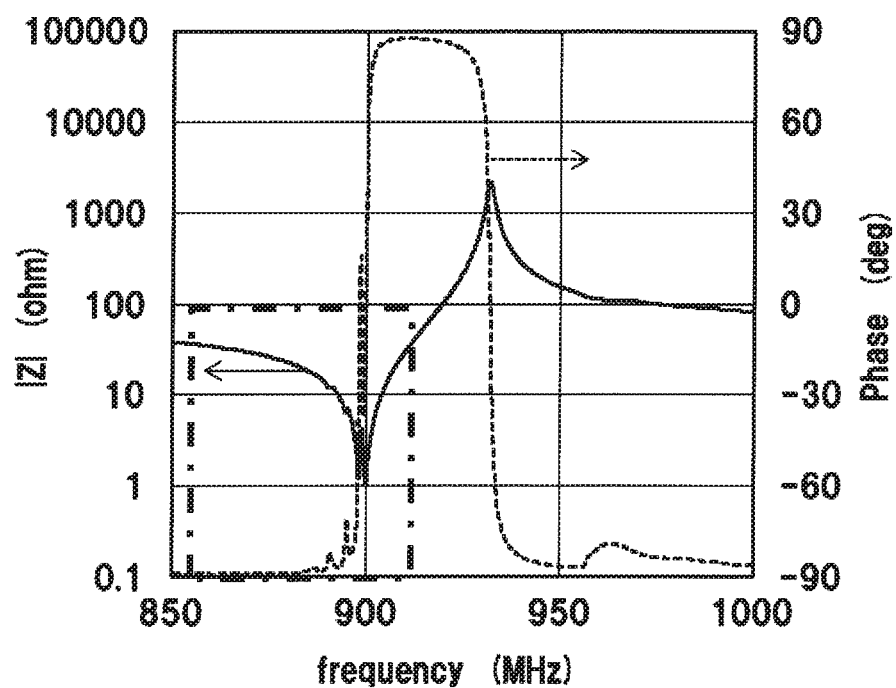
Figure 10B:
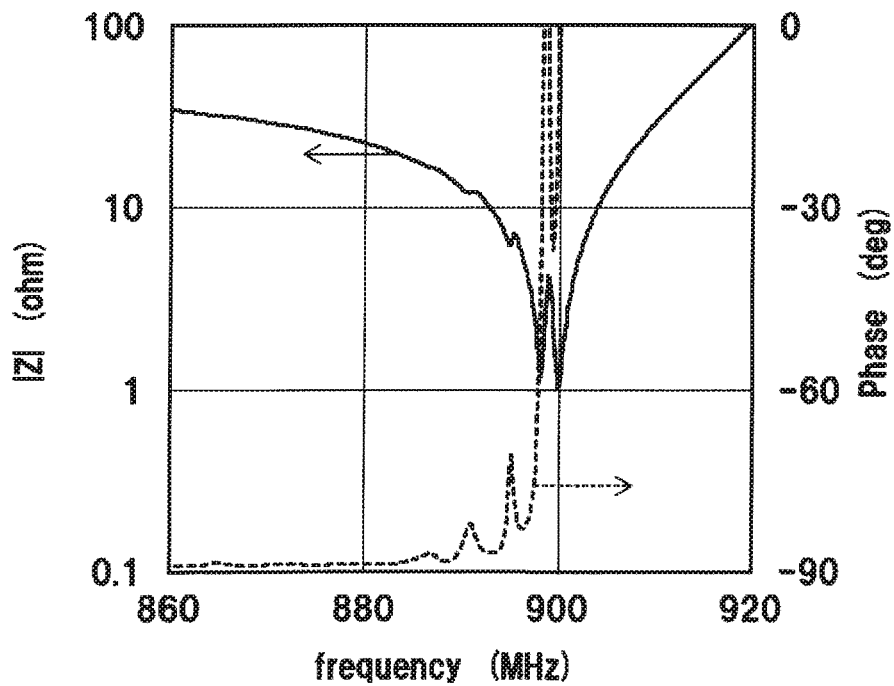
FIG. 10B is an enlargement of a portion in FIG. 10A.
Figure 11A:
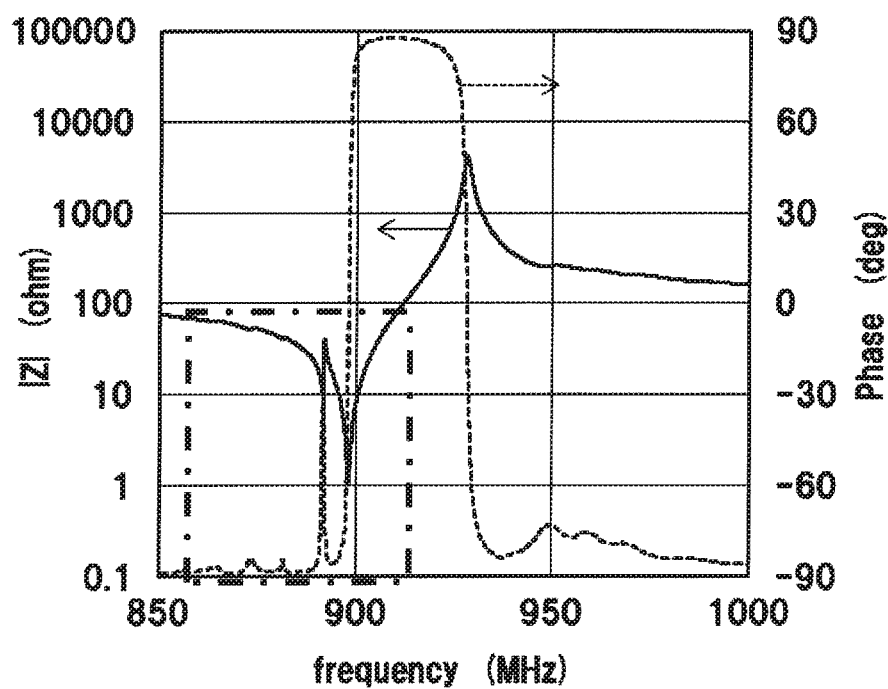
FIGS. 11A and 11B show results of simulation of an acoustic wave element according to Comparative Example 3, where
Figure 11B:
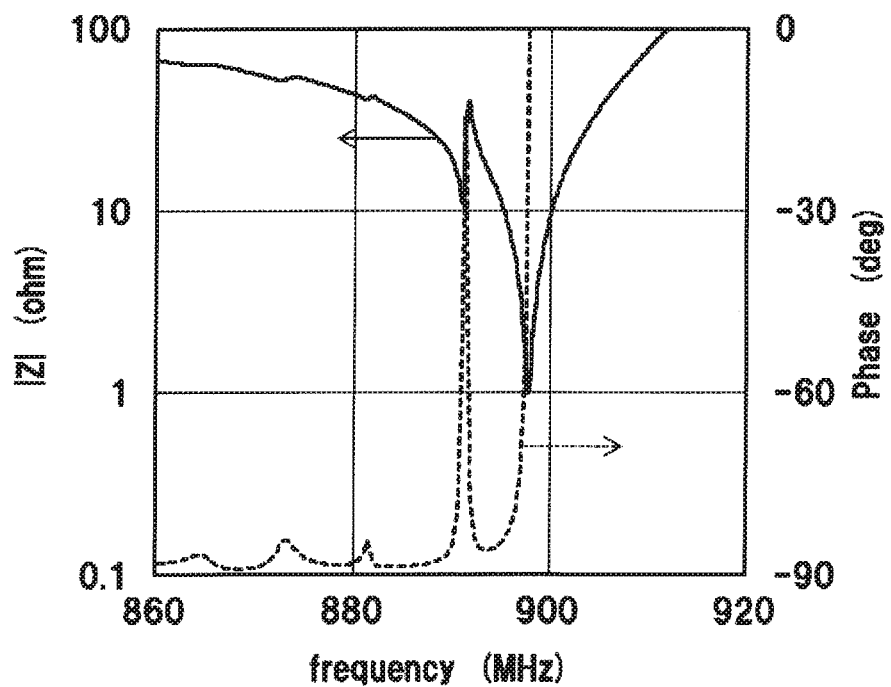

The results of simulation under the conditions of the SAW element in Comparative Example 2 are shown in FIGS. 10A and 10B, and the results of simulation under the conditions of the SAW element in Comparative Example 3 are shown in FIGS. 11A and 11B. The graphs shown in FIGS. 10A and 10B and FIGS. 11A and 11B show frequencies on the abscissas and show absolute values |Z| of impedance or phases of impedance on the ordinates.

As shown by the SAW element in Comparative Example 2, when only the gap Gp2 which is the changed part 300 is set to a predetermined value, as shown in FIGS. 10A and 10B, the spurious response at approximately 890 MHz which was generated in the SAW element in Comparative Example 1 can be reduced, but a large spurious response is generated at approximately 895 MHz in the vicinity of the resonant frequency. This is considered to be caused by generation of a vibration mode (so-called longitudinal mode) having a plurality of peaks along the propagation direction of the acoustic wave in the IDT electrode 3.

On the other hand, as shown by the SAW element in Comparative Example 3, when only the resonant frequency of the reflectors is set to a predetermined value, as shown in FIGS. 11A and 11B, it is seen that a new spurious response (believed to be spurious response of longitudinal mode) is generated at approximately 893 MHz although the spurious response at approximately 890 MHz which was generated in the SAW element in Comparative Example 1 can be reduced.

From the above description, according to the SAW element in the present embodiment, by designing (I) the outer region 3b including the changed part 300 on the side nearer the end part from the main region 3a and (II) the resonant frequency of the reflectors in a predetermined way, the spurious response of the reflector mode is reduced and the spurious response of the longitudinal mode can be reduced, therefore a spurious response which is generated at a frequency lower than the resonant frequency can be reduced.

Further, by setting the resonant frequency of the reflectors 4 lower than the resonant frequency in the main region 3a, the reflection frequency region of the reflectors 4 can be shifted to a lower frequency side than the resonant frequency in the main region 3a. For this reason, at the time when the SAW element 1 is operated at a frequency lower than the resonant frequency of the main region 3a, leakage of the acoustic wave generated in the main region 3a from the reflectors 4 can be prevented. Due to this, loss at the frequency lower than the resonant frequency of the main region 3a can be reduced.

Figure 16:
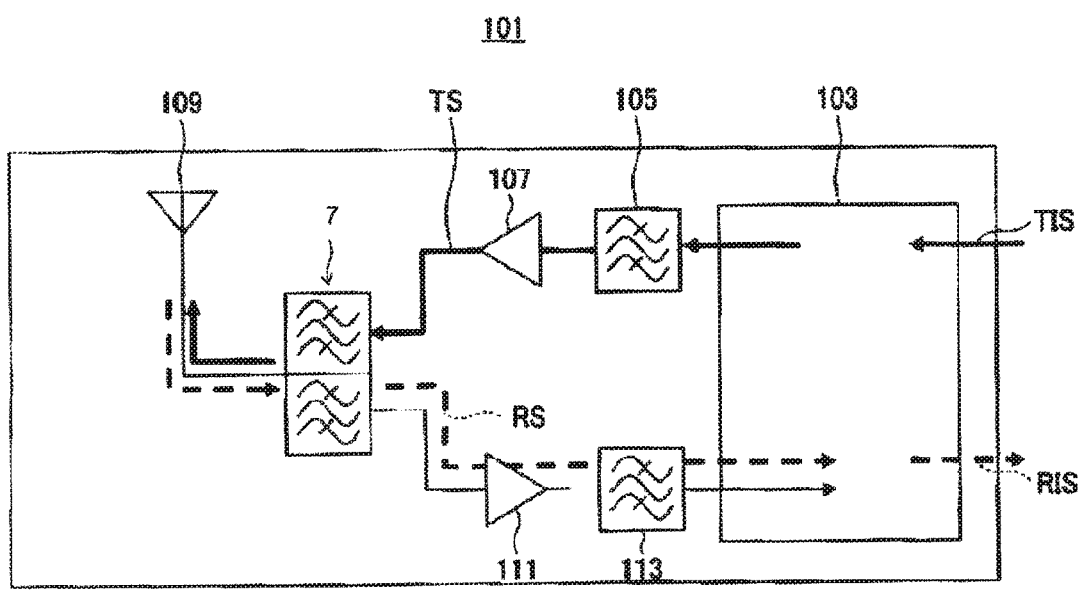
FIG. 16 is a diagram for schematically explaining a communication device according to an embodiment of the present invention.

From the above results, as shown in FIG. 16 which will be explained later, in the filter characteristic, the ripple and loss in the central part of the passband can be eliminated, and the characteristics of the reception band or transmission band can be improved.

Further, the changed part of the gap between the electrode finger A and the electrode finger B which becomes the changed part in the SAW element 1 in Example 1 explained above was set between the eighth and the ninth fingers from the end part but the study was carried out for the range exerting the above effects even when this setting was changed. Specifically, in the SAW element in Example 1, simulation was carried out by changing the positions of the electrode finger A and the electrode finger B. The results of that simulation will be shown in FIG. 12. In the graph shown in FIG. 12, the abscissa shows the position of the electrode finger B by the number "m from the end part (between m-th and (m+1)-th), and the ordinate shows the maximum phase peak of the spurious response. In this graph, the broken line parallel to the abscissa shows the maximum phase peak in the SAW element in Comparative Example 1. Note that, the second gap Gp2 was adjusted so that the maximum phase peak of the spurious response becomes the minimum for each number "m". In other words, FIG. 12 shows the minimum value of the maximum phase peak of the spurious response for each number "m".

It is seen from this result that when the number "m" is set to 70 or more, the maximum phase peak of the spurious response becomes worse than that in Comparative Example 1, therefore the above effects are exhibited by setting the number "m" smaller than 70. As a result, at the time when the number "m" is 8, the maximum phase peak of the spurious response can be adjusted to −90 deg, therefore it is seen that the spurious response can be greatly reduced.

Figure 12:
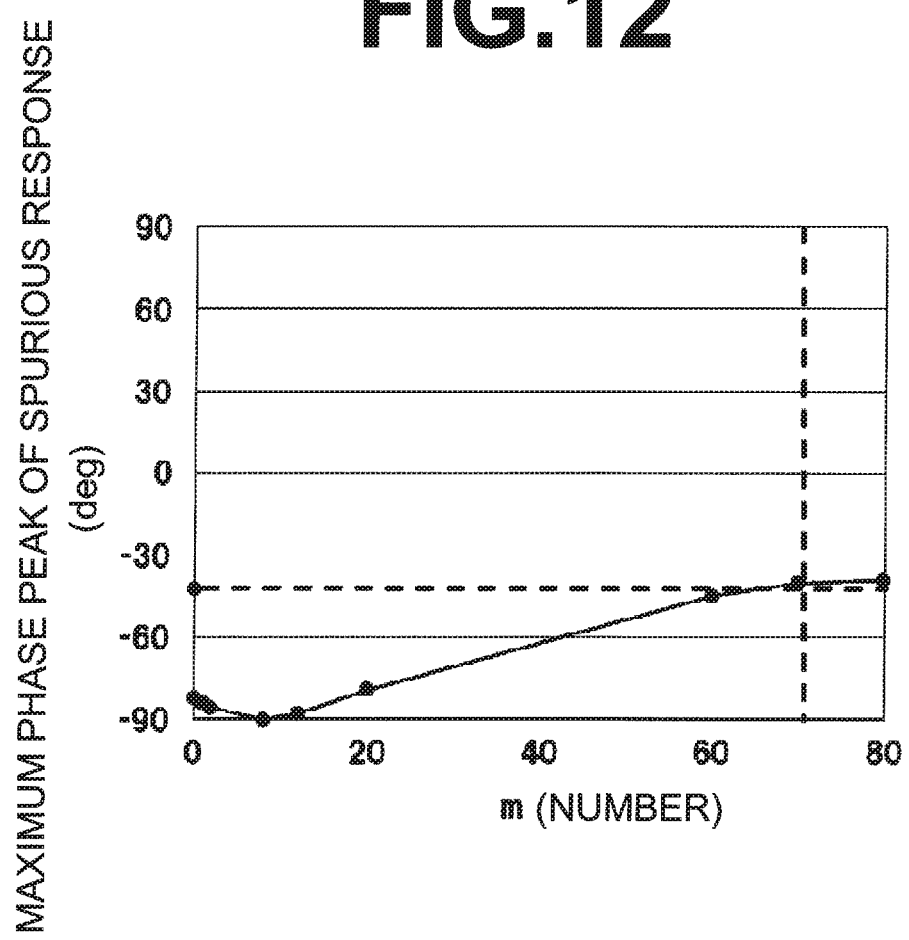
FIG. 12 shows results of simulation of a range of position of a changed part exerting effects in the acoustic wave element according to Example 1.

On the other hand, it is seen from the results shown in FIG. 12 that even when the number "m" is 0, the maximum phase peak of the spurious response can be reduced more than the SAW element in Comparative Example 1. Note that, the time when the number "m" is 0 is a case where the interval between the IDT electrode 3 and the reflector 4 is changed to be reduced and the electrode finger 32 does not exist in the outer region 3b. Even in this case, the interval between the electrode finger B and the reflector electrode finger C is made narrower than the original interval. From the above results, when the position of the electrode finger B is indicated by the number "m" from the end part, the changed part of the gap exerting the above effects is set in a range of 0≤m<70.

Note that, in the example explained above, the part at which the electrode finger design in the IDT electrode 3 was modified was the only second gap Gp2. That is, the gap between the adjoining electrode fingers 32 in the outer region 3b is equal to the first gap Gp1, and the electrode finger width, electrode finger thickness, and pitch are equal to those in the main region 3a. In this way, by making the arrangement of the electrode fingers 32 in the outer region 3b close to the arrangement of the electrode fingers 32 in the main region 3a, unintended loss or leakage of the surface wave can be suppressed. Further, by reducing the portion in which the gap becomes small, a drop in the power handling ability can be suppressed.

(Other Method 1 of Controlling Distance Between Electrode Finger A and Reflector Electrode Finger C)

In the example explained above, the method of changing the second gap Gp2 of the IDT electrode 3 was explained as the electrode finger design of the outer region 3b of the IDT electrode 3, but the width w1a of the electrode finger 32 of the IDT electrode 3 may be changed as the changed part 300 as well.

Figure 13:
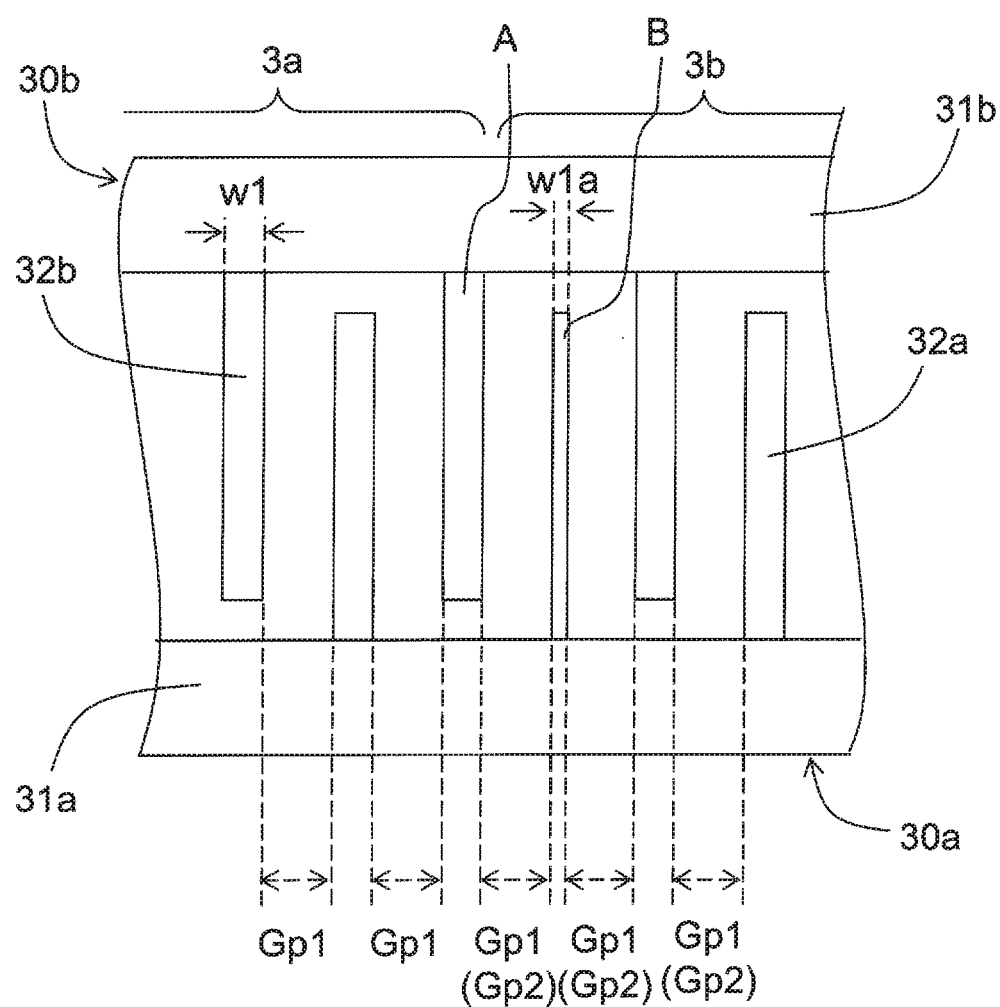
FIG. 13 is a plan view showing a modification (Example 2) of the acoustic wave element according to an embodiment of the present invention.

Specifically, as shown in FIG. 13, in the changed part 300, it is enough that the width w1a of the electrode finger 32 (electrode finger B) is set narrower than the width w1 of the electrode finger 32 in the main region 3a, and the second gap Gp2 is set to become the same as the first gap Gp1. Even with setting in this way, the entire array part of the IDT electrode 3 on the side nearer the end part from the changed part 300 can be shifted to the side of the array part of the IDT electrode 3 in the main region 3a.

In this case, the region on the side nearer the end part from the electrode finger A becomes the outer region 3b, and the outer region 3b includes the changed part 300.

It was confirmed by simulation that the SAW element (Example 2) according to the present embodiment exerted the effects even in a case where the width w1a of the electrode finger 32 was changed in this way. The conditions of simulation of the SAW element according to Example 2 will be shown. Note that, the following conditions show only the portions which are different from the SAW element in Comparative Example 1.

(Simulation Conditions of Example 2)
[IDT Electrode 3]
  Electrode fingers 32 of IDT electrode 3
  Position of changed part 300 (position of electrode finger B): Ninth (from end part of IDT electrode 3)
  Width w1a of electrode finger 32 of changed part 300: (Width w1 of electrode finger 32 of main region 3a)×0.90
[Reflectors 4]
  Pitch Pt2 of reflector electrode fingers 42: First pitch Pt1a×1.02

Figure 14A:
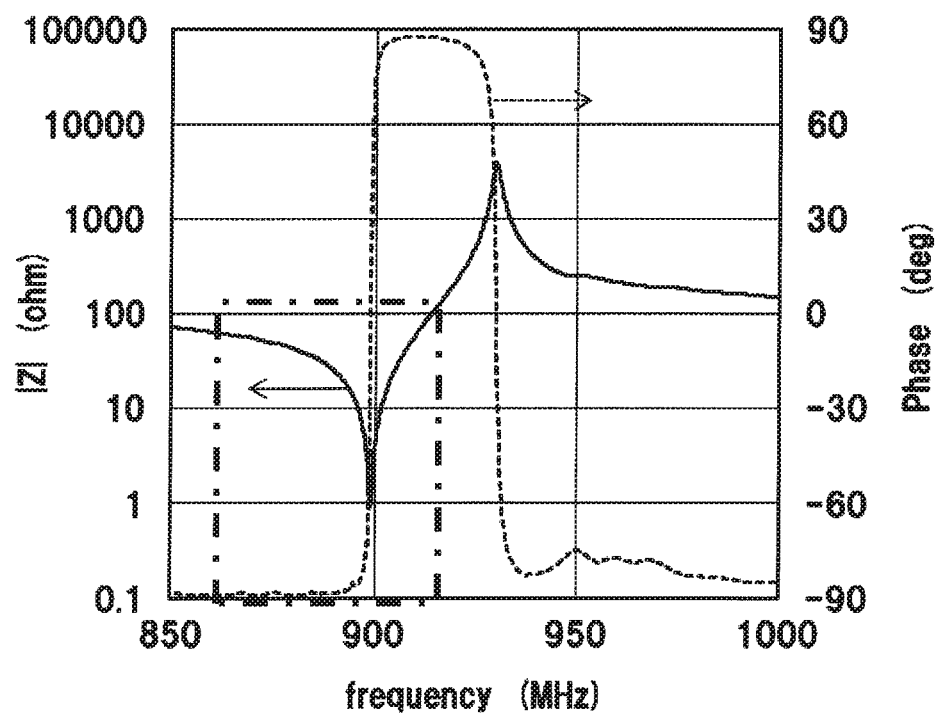
FIGS. 14A and 14B show results of simulation of an acoustic wave element according to Example 2.
Figure 14B:
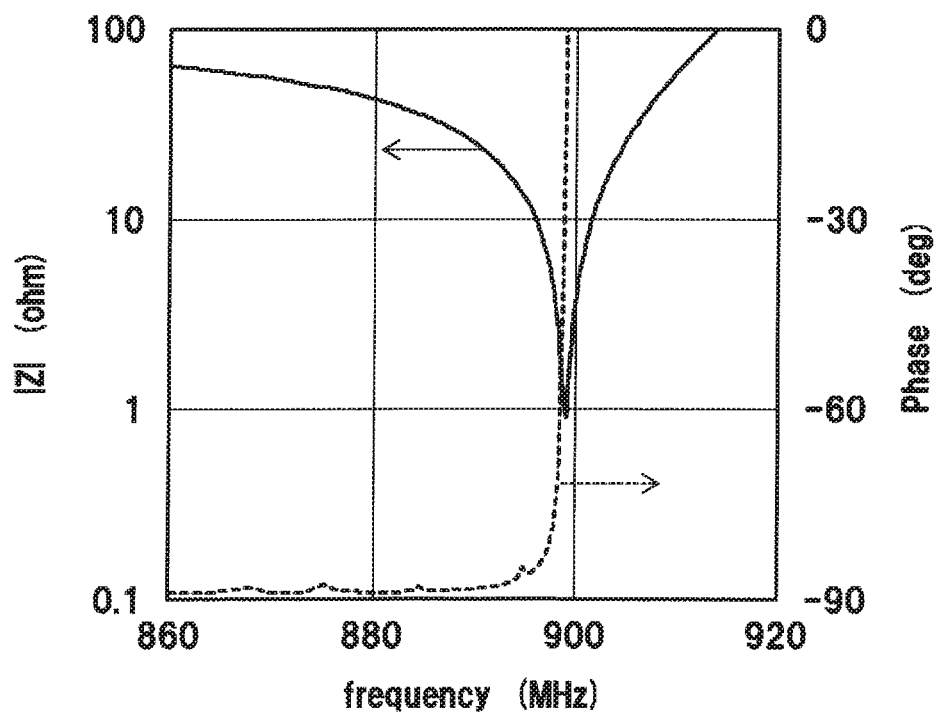

The results of simulation of the SAW element in Example 2 computed under such conditions are shown in FIGS. 14A and 14B. The graphs shown in FIGS. 14A and 14B show frequencies on the abscissas and show absolute values |Z| of impedance or phases of impedance on the ordinates. Further, FIG. 14B is an enlargement of the portion which is surrounded by a one-dot chain line in FIG. 14A. Note that, the present simulation is a case where one width w1a of the electrode finger 32 (electrode finger B) of the IDT electrode 3 which is located on the side nearer the end part from the main region 3a is changed.

Even in the case where the width w1a of the electrode finger 32 of the IDT electrode 3 is changed as the changed part 300 in this way, in the same way as Example 1, the spurious response of the longitudinal mode is reduced, and the spurious response of impedance which was generated at approximately 890 MHz in Comparative Example 1 can be reduced.

Figure 15:
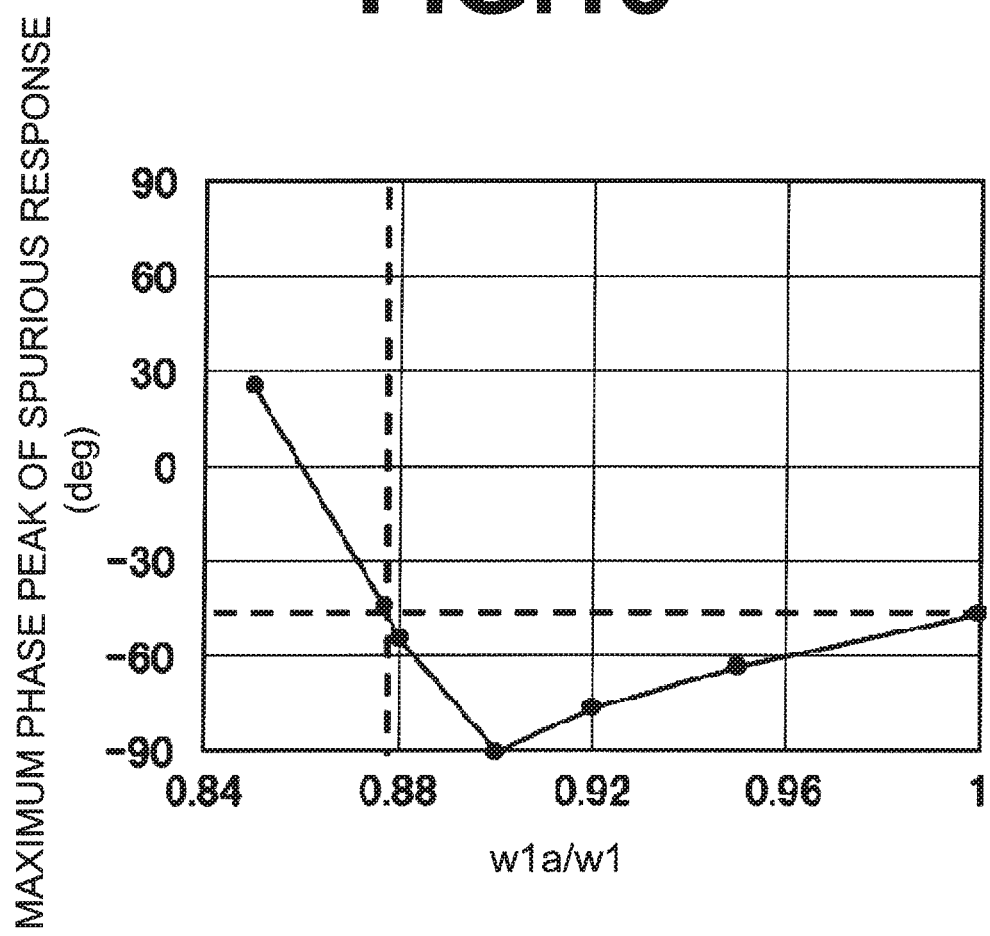
FIG. 15 shows results of simulation of the range of a changed part exerting effects in the acoustic wave element according to Example 2.

Further, the range having an effect with respect to Comparative Example 1 was simulated by changing the width w1a of the electrode finger 32. The results thereof will be shown in FIG. 15. In FIG. 15, the abscissa shows the width (wa1/w1) of the electrode finger B (electrode finger 32 in the changed part 300) with respect to the width of the electrode finger 32 in the main region 3a, and the ordinate shows the maximum phase peak of the spurious response. Further, the maximum phase peak in the SAW element in Comparative Example 1 is indicated by the broken line parallel to the abscissa.

It is seen from this result that by setting the width w1a of the electrode finger 32 to range 0.877 times or more to less than 1 times to the width w1 of the electrode finger 32 in the main region 3a, the effect is greater compared with Comparative Example 1.

(Other Method 2 of Controlling Distance Between Electrode Finger A and Reflector Electrode Finger C)

In Example 1 and Example 2 explained above, by adjusting the gap between the electrode finger A and the electrode finger B and adjusting the width of the electrode finger B, the desired condition of the distance between the electrode finger A and the reflector electrode finger C was satisfied. However, this may be realized by setting the resonant frequency as determined according to the electrode finger design of the outer region 3b higher than the resonant frequency as determined according to the electrode finger design of the main region 3a as well.

The resonant frequency of the parts of the IDT electrode 3 located at the main region 3a and outer regions 3b can be changed by adjusting the pitch Pt1 of the IDT electrode 3. Specifically, it is enough that the pitch Pt1 is made narrower in order to make the resonant frequency higher, while it is enough that the pitch Pt1 is made broader in order to make the resonant frequency lower. For this reason, in the IDT electrode 3, in order to set the resonant frequency of the main region 3a lower than the resonant frequency of the outer regions 3b, it is enough that the first pitch Pt1a is set to become broader than the second pitch Pt1b.

In order to confirm the effects of the SAW element in which the resonance frequencies of the IDT electrode 3 and the reflectors 4 were set at the predetermined values as in the present embodiment, the frequency characteristics of the SAW element were simulated.

Next, the conditions of the SAW element (Example 3) according to the present embodiment will be shown. Note that, the following conditions show only the portions which are different from the SAW element in Comparative Example 1 described above.

(Simulation Conditions of Example 3)
[IDT Electrode 3]
 Electrode fingers 32 of IDT electrode 3:
 Number of electrode fingers 32 in outer region 3b: 12 (from end part of IDT electrode 3)
 Second pitch Pt1b: First pitch Pt1a×0.990
[Reflector 4]
 Pitch Pt2 of reflector electrode fingers 42: First pitch Pt1a×1.02

Figure 20A:
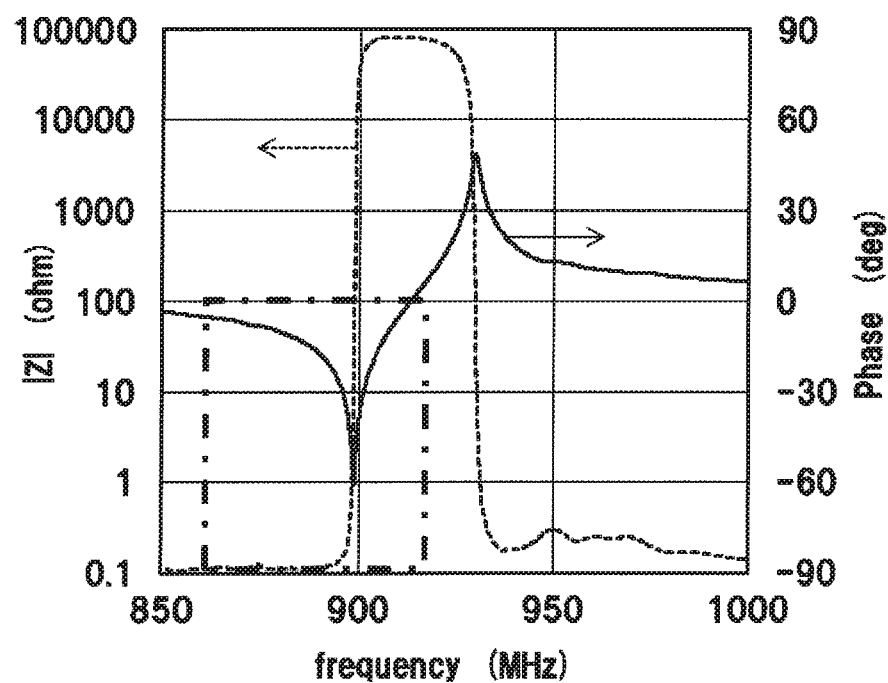
FIGS. 20A and 20B show results of simulation of an acoustic wave element according to Example 3, where
Figure 20B:
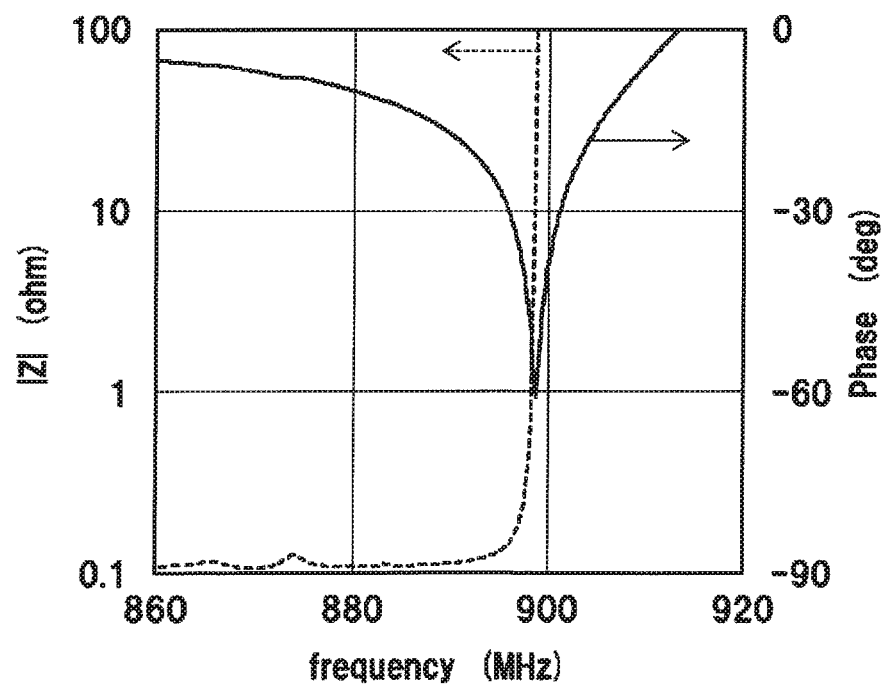

The results of simulation of the SAW element according to the present embodiment computed under such conditions are shown in FIGS. 20A and 20B. The graphs shown in FIGS. 20A and 20B show frequencies on the abscissas and show absolute values |Z| of impedance or phases of impedance on the ordinates. Note that, the present Example 3 is a case where all the IDT electrode 3 located in the outer regions 3b are given the first pitch Pt1a. FIG. 20B is an enlargement of the portion surrounded by a one-dot chain line in FIG. 20A. It is seen from this result that the spurious response which was generated at approximately 890 MHz in Comparative Example 1 can be reduced.

Further, in order to confirm the effects of the SAW element (Example 3) according to the present embodiment, simulation was carried out by applying (I) a case where only the resonant frequency of the outer regions 3b was set at a predetermined value as Comparative Example 4 and (II) a case where only the resonant frequency of the reflectors was set at a predetermined value as Comparative Example 5. In other words, the resonant frequency of the reflectors is equal to that of the main region 3a of the IDT electrode 3 in Comparative Example 4, and the electrode finger design of the IDT electrode 3 becomes uniform in Comparative Example 5. The correspondence table of Example 3 and Comparative Examples 1, 4, and 5 is shown in Table 2.

TABLE 2

|  | Second pitch Pt1b (outer regions 3b) | Number (outer regions 3b) | Pitch Pt2 (reflectors) |
| --- | --- | --- | --- |
| Comparative Example 1 | — | — | — |
| Comparative Example 4 | 0.990 times | 12 | — |
| Comparative Example 5 | — | — | 1.02 times |
| Example 3 | 0.990 times | 12 | 1.02 times |

In Table 2, the column "second pitch Pt1b" indicates the multiplying factor with respect to the first pitch Pt1a. Specifically, in the SAW element in Comparative Example 4, the second pitch Pt1b is set to 0.990 times to the first pitch Pt1a. Further, in Table 2, the column of the pitch Pt2 of the reflector 4 indicates the multiplying factor with respect to the first pitch Pt1a of the IDT electrode 3.

Figure 21A:
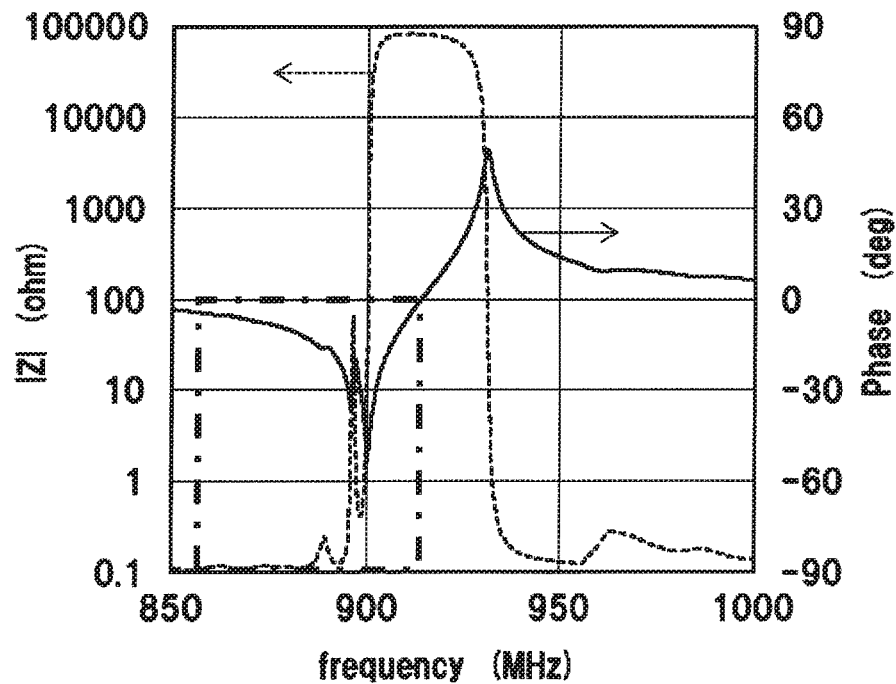
FIGS. 21A and 21B show results of simulation of an acoustic wave element according to Comparative Example 3, where
Figure 21B:
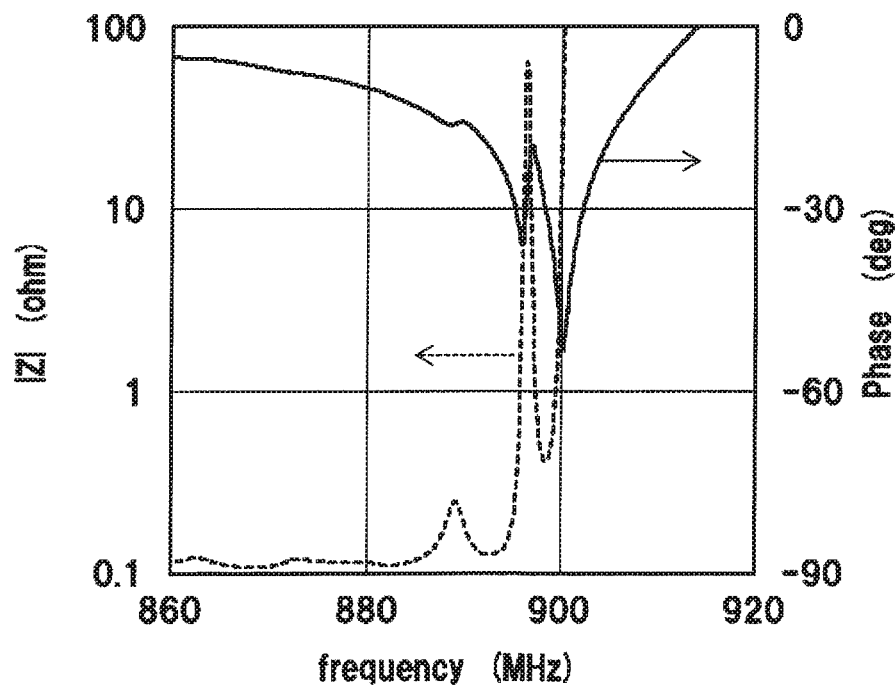
Figure 22A:
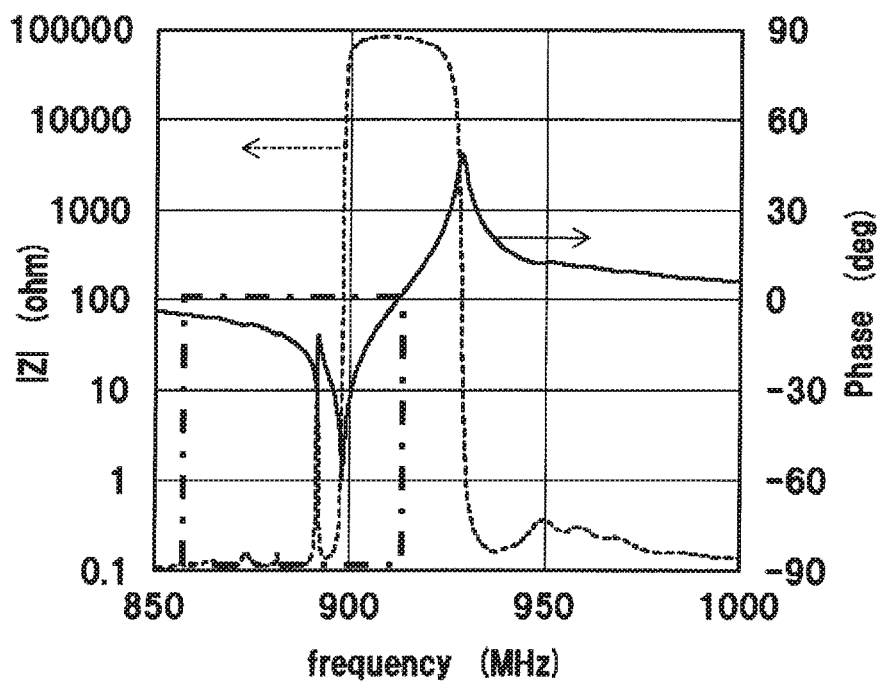
FIGS. 22A and 22B show results of simulation of an acoustic wave element according to Comparative Example 4, where
Figure 22B:
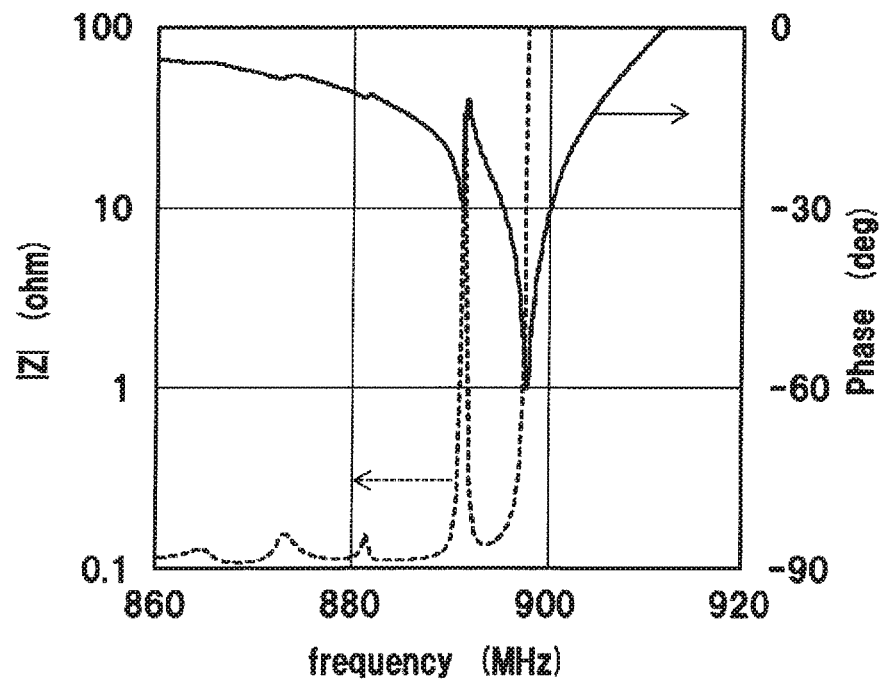

The results of simulation under the conditions of the SAW element in Comparative Example 4 are shown in FIGS. 21A and 21B, and the results of simulation under the conditions of the SAW element in Comparative Example 5 are shown in FIGS. 22A and 22B. The graphs shown in FIGS. 21A and 21B and FIGS. 22A and 22B show frequencies on the abscissas and show absolute values |Z| of impedance or phases of impedance on the ordinates.

As shown by the SAW element in Comparative Example 4, when only the resonant frequency of the outer regions is set to a predetermined value, as shown in FIGS. 21A and 21B, the spurious response at approximately 890 MHz which was generated in the SAW element in Comparative Example 1 can be reduced, but a large spurious response is generated at approximately 895 MHz in the vicinity of the resonant frequency.

On the other hand, as shown by the SAW element in Comparative Example 5, when only the resonant frequency of the reflectors is set at a predetermined value, as shown in FIGS. 22A and 22B, it is learned that the spurious response at approximately 890 MHz which was generated in the SAW element in Comparative Example 1 can be reduced, but a new spurious response (believed to be spurious response of longitudinal mode) is generated at approximately 890 MHz.

From the above description, according to the SAW element of the present embodiment, by setting (I) the resonant frequency of the outer regions 3b and (II) the resonant frequency of the reflectors at the predetermined values, the spurious response of the reflector mode can be reduced, and the spurious response of the longitudinal mode can be reduced, therefore a spurious response which is generated at a frequency lower than the resonant frequency can be reduced.

Next, simulation was carried out for the optimum value of the second pitch Pt1b. The conditions of simulation were as follows. Note that, the following conditions show only the portions different from the SAW element in Comparative Example 1.

(Conditions for Optimum Value of Second Pitch Pt1b in Example 3)
[IDT electrode 3]
 Number: 200
[Reflectors 4]
 Pitch Pt2: First pitch Pt1a×1.02

Under such conditions, the computation was carried out while changing the second pitch Pt1b. The results are shown in FIG. 23. In the graph shown in FIG. 23, the abscissa shows the second pitch Pt1*b*, and the ordinate shows the maximum phase peak of the spurious response in the frequency lower than the resonant frequency. Further, the maximum phase peak in the SAW element in Comparative Example 1 is indicated by a broken line parallel to the abscissa.

It is seen from the results shown in FIG. 23 that the above effects are exhibited by setting the second pitch Pt1*b* to be not less than 0.986 times, but smaller than 1 time to the first pitch Pt1*a*. Further, it is seen from the results shown in FIG. 23 that, at the time when the second pitch Pt1*b* is controlled to 0.991×Pt1*a*, the maximum phase peak of the spurious response can be substantially eliminated (corresponding to −90 deg in the results shown in FIG. 23), therefore the spurious response can be greatly reduced.

Figure 24:
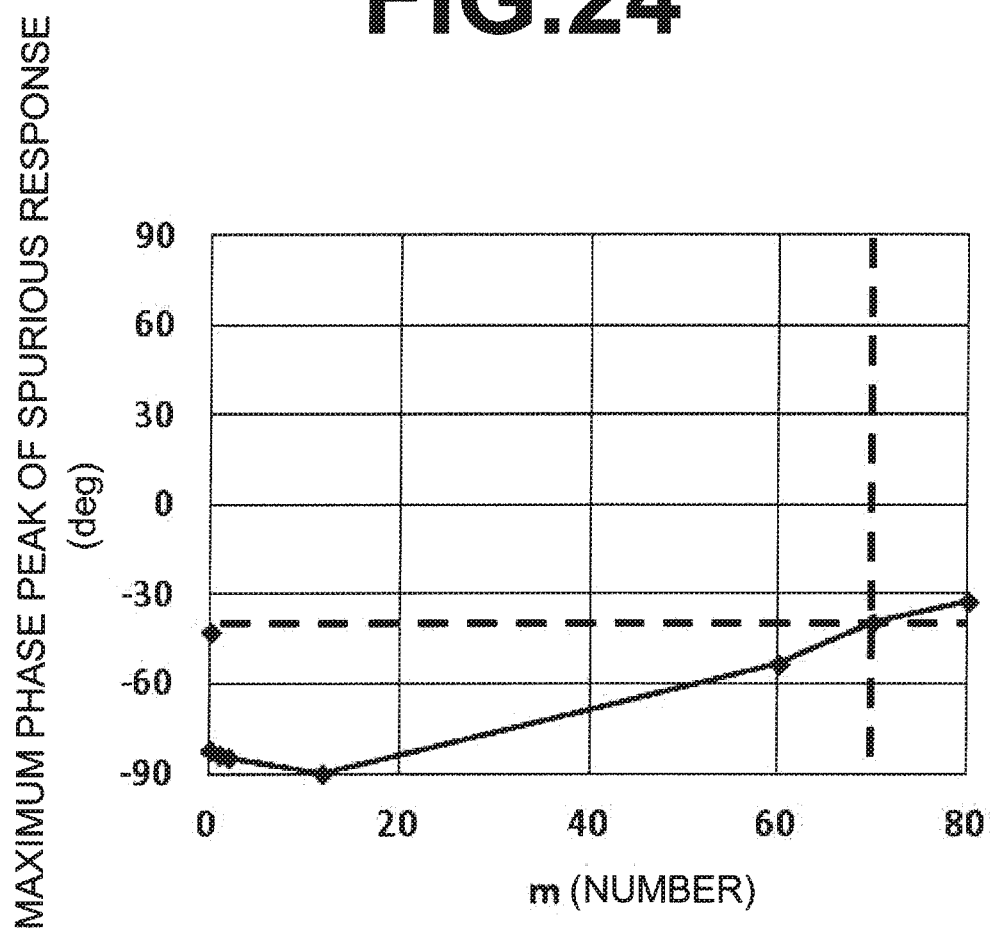
FIG. 24 shows results of simulation of the acoustic wave element according to Example 3.

Further, the outer regions 3*b* were set as 12 fingers from the end parts of the IDT electrode 3 in the SAW element in Example 3 explained above, but the range exerting the above effects even if this setting of outer regions 3*b* was changed was studied. Specifically, simulation was carried out by changing the number of the electrode fingers 32 in the outer regions 3*b* in the SAW element in Example 3. The results of that simulation are shown in FIG. 24. In the graph shown in FIG. 24, the abscissa shows the number "m" of the electrode fingers 32 in the outer regions 3*b*, and the ordinate shows the maximum phase peak of the spurious response. Note that, the second pitch Pt1*b* was adjusted so that the maximum phase peak of the spurious response becomes the minimum for each number "m". In other words, FIG. 24 shows the minimum value of the maximum phase peak of the spurious response for each number "m".

It is seen from this result that when the number "m" in the outer regions 3*b* is made 70 or more, the maximum phase peak of the spurious response becomes larger than in Comparative Example 1 and the characteristics become worse, therefore the above effects are secured by making the number "m" smaller than 70. As a result, it is seen that the maximum phase peak of the spurious response can be controlled to −90 deg when the number "m" is 12, therefore the spurious response can be greatly reduced. On the other hand, even in a case where the number "m" is 0, it is seen from FIG. 24 that the maximum phase peak of the spurious response can be reduced more than the SAW element in Comparative Example 1. Note that, the time when the number "m" is 0 means a change of the interval between the IDT electrode 3 and the reflectors 4. From the above results, the number "m" of the electrode fingers 32 in the outer regions 3*b* in the SAW element 1 is set in the range of 0≤m<70.

(Other Method for Setting Resonant Frequency of Outer Region to Predetermined Value)

As the method of setting the resonant frequency of the outer regions 3*b* of the IDT electrode 3 to a predetermined value, the method of changing the second pitch Pt1*b* of the IDT electrode 3 was explained. However, the duty of the parts of the IDT electrode 3 located at the outer regions 3*b* may be changed as well.

The duty of the IDT electrode 3 is, as shown in FIG. 3, a value obtained by dividing the width w1 of the second electrode finger 32*b* by a distance Dt1 from the end part of the first electrode finger 32*a* on one side of the second electrode finger 32*b* in the propagation direction of the acoustic wave up to the end part on the other side of the second electrode finger 32*b*. In the case where the resonant frequency of the outer regions 3*b* is changed by changing the duty of the electrode fingers 32 in this way, it is enough that the duty is made smaller in order to make the resonant frequency of the IDT electrode 3 higher, while it is enough that the duty is made larger in order to make the resonant frequency of the IDT electrode 3 lower. For this reason, the IDT electrodes 3 which are located in the outer regions 3*b* are set so that their duty becomes smaller than the duty of the IDT electrode 3 which is located in the main region 3*a*.

It was confirmed by simulation that the SAW element (Example 4) according to the present embodiment exhibited the above effects even in the case where the duty was changed in this way. Next, the conditions of simulation of the SAW element according to Example 4 will be shown. Note that, the following conditions show only the portions which are different from the SAW element in Comparative Example 1.

(Simulation Conditions of Example 4)
[IDT Electrode 3]
  Electrode fingers 32 of IDT electrode 3:
  Number of electrode fingers 32 in outer regions 3*b*: 20 (from end part of IDT electrode 3)
  Duty of electrode fingers 32 in outer regions 3*b*: (duty of electrode fingers 32 in main region 3*a*)×0.86
[Reflectors 4]
  Pitch Pt2 of reflector electrodes 42: First pitch Pt1*a*×1.02

Figure 25A:
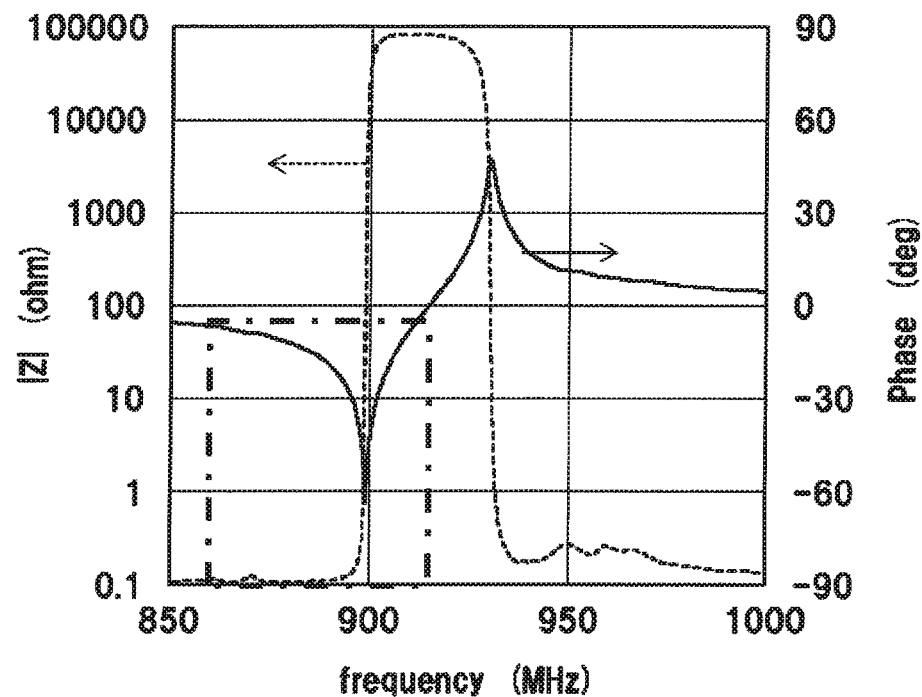
FIGS. 25A and 25B show results of simulation of an acoustic wave element according to Example 4.
Figure 25B:
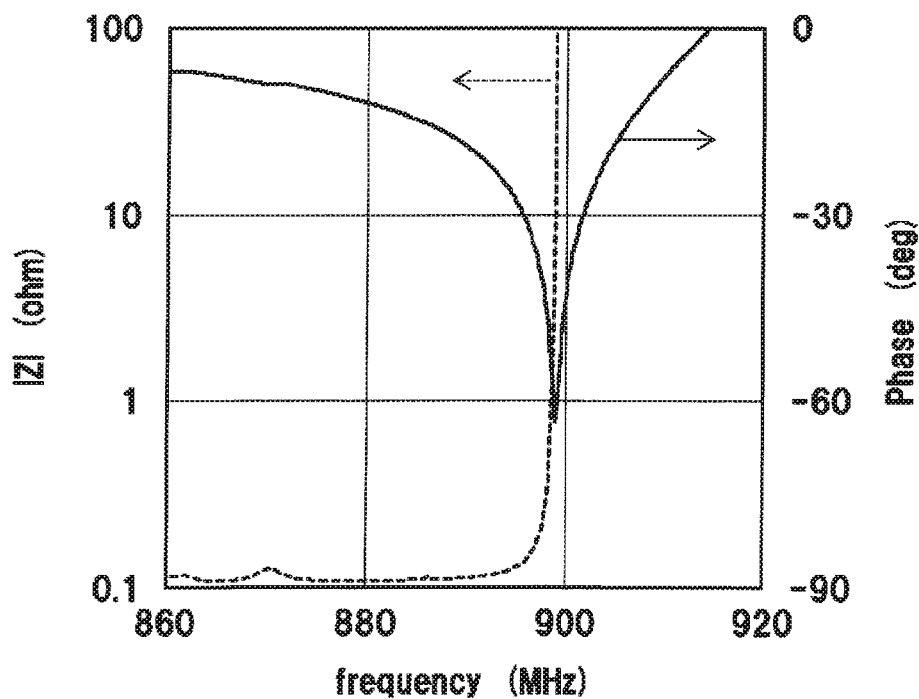

The results of simulation of the SAW element in Example 4 computed under such conditions are shown in FIGS. 25A and 25B. The graphs shown in FIGS. 25A and 25B show frequencies on the abscissas and show absolute values |Z| of impedance or phases of impedance on the ordinates. Further, FIG. 25B is an enlargement of the portion which is surrounded by a one-dot chain line in FIG. 25A. Note that, in the present simulation, the duties of the IDT electrode 3 located in the outer regions 3*b* were all changed.

Even in the case where the duties of the IDT electrode 3 located in the outer regions 3*b* were changed in this way, in the same way as Example 3, the spurious response of the longitudinal mode can be reduced, and the spurious response of impedance which was generated at approximately 890 MHz in Comparative Example 1 can be reduced.

In the explanation of the embodiment including Example 1 to Example 4 as described above, the method of changing the pitch Pt2 was explained as the method of changing the resonant frequency of the reflectors 4. However, as another method, use can be made of a method of changing the duty of the reflector electrodes 42, a method of changing the film thickness "s" of the electrode fingers 32 and reflector electrode fingers 42, and so on. In a case where the resonant frequency of the reflectors 4 is changed by other than the pitch Pt2, when the first pitch Pt1*a* of the IDT electrode 3 is set to the half wavelength of the wavelength λ of the acoustic wave, it is enough that the pitch Pt2 is set to the same extent as the pitch Pt1*a*. Here, the wavelength λ (2×Pt2) is for example 1.5 μm to 6 μm.

Note that, the present embodiment showed only the case where the design parameters as the electrode finger design (number, crossing width, pitch, duty, thickness of electrode, frequency etc.) were specified. However, the present invention exhibits the effect of reducing a spurious response for a SAW element having any parameters. For example, from the examples of Example 1, the fact that a good spurious response suppression effect was exhibited by the position of the changed part 300 (number from the end part) or gaps Gp (first gap Gp1, second gap Gp2) similar to Example 1 even when the number and crossing width of the electrode fingers of the IDT electrode were changed was confirmed by simulation.

Further, in Example 1, in addition to the adjustment of the second gap Gp2 to the predetermined value, the resonant frequency due to the electrode finger design of the outer regions 3b may be set to become higher than the resonant frequency due to the electrode finger design of the main region 3a as well. By setting the resonant frequency due to the electrode finger design of the outer regions 3b to become higher in this way, the same effects as those by setting the second gap Gp2 as explained before are obtained, and the spurious response of longitudinal mode can be further reduced.

In order to set the resonant frequency of the IDT electrode 3 located in the outer regions 3b to become higher than the resonant frequency of the IDT electrode 3 located in the main region 3a, it is enough that the second pitch Pt1b of the IDT electrode 3 located in the outer regions 3b is made narrower. The second pitch Pt1b of the IDT electrode 3 located in the outer region 3b is for example set to a range of 0.986× to less than 1× the first pitch Pt1a of the IDT electrode 3 located in the center region 3a. By configuring the device in this way, the distance between the electrode finger A and the reflector electrode finger C can be further controlled to the desired relationship.

In a filter or duplexer, the characteristics are exhibited by combining a plurality of resonators of a variety of numbers and crossing widths. However, when using the SAW element in the present invention as a resonator, the design values of the IDT electrode and reflectors can be set for the above plurality of resonators. For this reason, even in the case where the SAW element of the present invention is used for a filter or duplexer, the design can be carried out in the same way as the case where a conventional acoustic wave element is used.

Further, when design parameters (frequency, electrode thickness, etc.) other than the number and crossing width are changed, the position of the changed part 300 (number "m" from the end part), gap Gp, and so on may be suitably set to the optimum values. For this, use may be made of simulation using the coupling-of-modes (COM) method. Specifically, by performing simulation while changing the position of the changed part 300 (number "m" from the end part), gap Gp, and so on after setting the design parameters of the resonator, the conditions under which a spurious response is reduced well can be found.

As the number "m" of the electrode fingers 32 configuring the outer region 3b, there is an ideal number depending on the total number of the electrode fingers 32 configuring the IDT electrode 3. However, this can be determined by simulation using the COM method. Further, even if the number is other than this ideal number, the spurious response can be reduced. In the range of the total number (about 50 to 500) of the electrode fingers 43 configuring the IDT electrode 3 which is generally designed as the SAW element 1, it is confirmed that good characteristics can be obtained in a case where the number "m" is about 5 to 20.

<Summary of Configurations of Communication Device and Duplexer>

FIG. 16 is a block diagram showing a principal part of a communication device 101 according to an embodiment of the present invention. The communication device 101 is for performing wireless communications utilizing radio waves. The duplexer 7 has a function of branching a signal of the transmission frequency and a signal of the reception frequency in the communication device 101.

In the communication device 101, a transmission information signal TIS containing the information to be transmitted is modulated and raised in frequency (converted to a high frequency signal of a carrier frequency) by an RF-IC 103 to obtain a transmission signal TS. The transmission signal TS is stripped of unnecessary components other than the passband for transmission by a band pass filter 105, amplified by an amplifier 107, and input to the duplexer 7. The duplexer 7 strips the unnecessary components other than the passband for transmission from the input transmission signal TS and outputs the result to an antenna 109. The antenna 109 converts the input electrical signal (transmission signal TS) to a wireless signal and transmits the result.

In the communication device 101, the wireless signal received by the antenna 109 is converted to an electrical signal (reception signal RS) by the antenna 109 and is input to the duplexer 7. The duplexer 7 strips the unnecessary components other than the passband for reception from the input reception signal RS and outputs the result to an amplifier 111. The output reception signal RS is amplified by the amplifier 111 and is stripped of unnecessary components other than the passband for reception by a band pass filter 113. Further, the reception signal RS is lowered in frequency and demodulated by the RF-IC 103 to obtain a reception information signal RIS.

Note that, the transmission information signal TIS and reception information signal RIS may be low frequency signals (baseband signals) containing suitable information. For example, they may be analog audio signals or digital audio signals. The passband of the radio signal is based on various standards such as the UMTS (Universal Mobile Telecommunications System). The modulation scheme may be any of phase modulation, amplitude modulation, frequency modulation, or a combination of any two or more among them.

Figure 17:
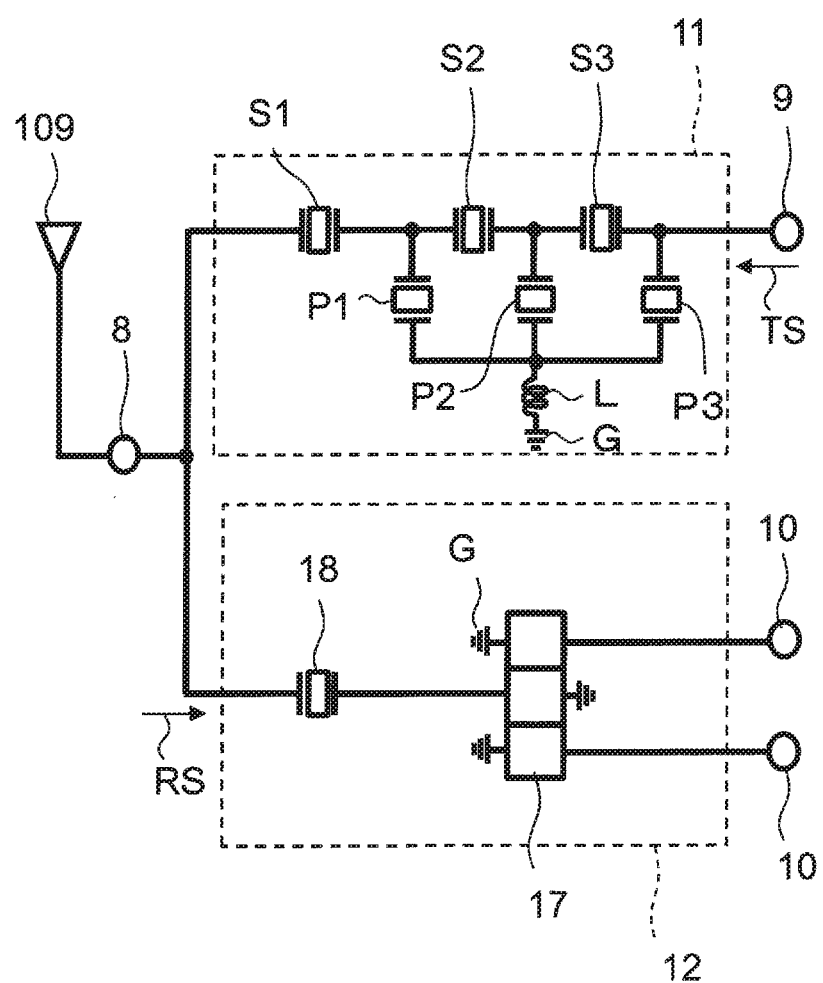
FIG. 17 is a circuit diagram for explaining a duplexer according to an embodiment of the present invention.

FIG. 17 is a circuit diagram showing the configuration of the duplexer 7 according to one embodiment of the present invention. The duplexer 7 is the duplexer 7 used in the communication device 101 in FIG. 16. The SAW element 1 is for example a SAW element configuring a ladder type filter circuit of the transmission filter 11 in the duplexer 7 shown in FIG. 16.

The transmission filter 11, as shown in FIG. 17, has a piezoelectric substrate 2 and has serial resonators S1 to S3 and parallel resonators P1 to P3 which are formed on the piezoelectric substrate 2.

The duplexer 7 is mainly configured by an antenna terminal 8, transmission terminal 9, reception terminals 10, a transmission filter 11 which is arranged between the antenna terminal 8 and the transmission terminal 9, and a receiving filter 12 which is arranged between the antenna terminal 8 and the reception terminals 10.

The transmission terminal 9 receives as input the transmission signal TS from the amplifier 107. The transmission signal TS input to the transmission terminal 9 is stripped of unnecessary components other than the passband for transmission in the transmission filter 11 and is output to the antenna terminal 8. Further, the antenna terminal 8 receives as input the reception signal RS from the antenna 109. This is stripped of unnecessary components other than the passband for reception in the receiving filter 12 and is output to the reception terminals 10.

The transmission filter 11 is for example configured by a ladder type SAW filter. Specifically, the transmission filter 11 has three serial resonators S1, S2, and S3 which are connected in series between the input side and the output side thereof and three parallel resonators P1, P2, and P3 which are provided between a serial arm which is a line for connecting the serial resonators to each other and the reference potential portion G. That is, the transmission filter 11 is a ladder type filter of a 3-stage configuration. Note, the ladder type filter in the transmission filter 11 may have any number of stages.

Between the parallel resonators P1 to P3 and the reference potential portion G, an inductor L is provided. By setting the inductance of this inductor L to a predetermined magnitude, an attenuation pole is formed in an area other than the passband of the transmission signal to make the out-of-band attenuation large. Each of the plurality of serial resonators S1 to S3 and plurality of parallel resonators P1 to P3 is configured by a SAW resonator.

The receiving filter 12 for example has a multimode type SAW filter 17 and an auxiliary resonator 18 which is connected in series to the input side thereof. Note that, in the present embodiment, the multimode includes a double mode. The multimode SAW filter 17 has a balance/unbalance conversion function. The receiving filter 12 is connected to two reception terminals 10 to which balanced signals are output. The receiving filter 12 is not limited to one which is configured by the multimode type SAW filter 17, but may be configured by a ladder type filter or may be a filter not having a balance/unbalance conversion function.

Between the connection point of the transmission filter 11, receiving filter 12, and antenna terminal 8 and the ground potential portion G, an impedance matching-use circuit configured by an inductor etc. may be inserted as well.

Figure 18:
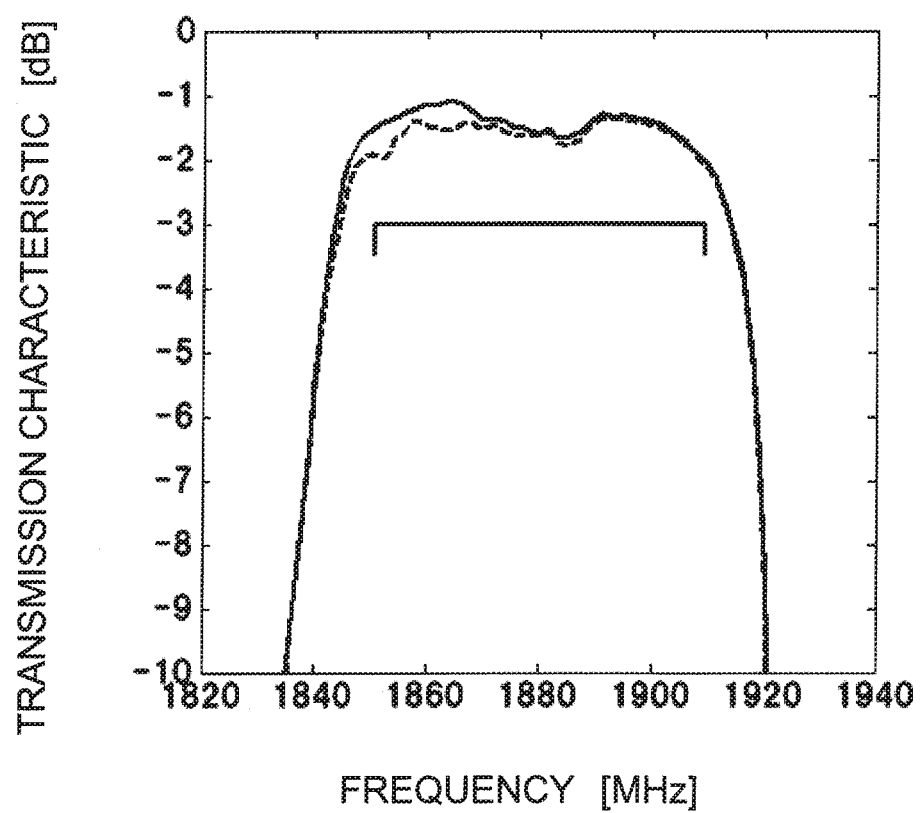
FIG. 18 shows results of simulation of the duplexer in FIG. 17.

By using the SAW element 1 explained above as the SAW resonator of such a duplexer 7, the filter characteristics of the duplexer 7 can be improved. The filter characteristics of the duplexer were found by simulation in the case where a SAW element 1 using the structure of the SAW element in Example 1 was applied to the serial resonators S1 to S3 of the transmission filter 11. Note that, as the passband of the duplexer 7, the transmission side of Band2 of UMTS was assumed. The results thereof are shown in FIG. 18. In the graph shown in FIG. 18, the abscissa shows the frequency (MHz), and the ordinate shows the pass characteristic (dB). Further, the broken line indicates the filter characteristic in the case where the SAW element in Comparative Example 1 is used, and a solid line indicates the filter characteristic where use is made of the SAW element 1 in Example 1. It is seen from the results shown in FIG. 18 that, in the passband on the transmission side, the transmission property of a frequency band lower than 1860 MHz can be improved.

In the so-called ladder type filter used as the transmission side filter of the duplexer 7 shown in FIG. 17, the resonant frequency of the serial resonators S1 to S3 is set to the vicinity of the center of the filter passband. Further, in the parallel resonators P1 to P3, the anti-resonant frequency thereof is set to the vicinity of the center of the filter passband. In a case where such a frequency arrangement is employed and the acoustic wave element of the present invention is used for the serial resonators S1 to S3, improvement can be achieved with respect to loss or ripple near the center of the filter passband.

In this regard, in the SAW element 1, as shown in FIGS. 7A and 7B and FIGS. 8A and 8B, a spurious response peak which is generated on the higher frequency side than the anti-resonant frequency (generated at approximately 960 MHz in FIG. 7(a)) is shifted to a lower frequency side (shifted by −10 MHz to the vicinity of 950 MHz in FIG. 8A). The shift of the operation band of the reflectors to the low frequency side along with a reduction of the resonant frequency of the reflectors is considered to be one of causes for this. The SAW element 1 in this case is improved in the electrical characteristics in the vicinity of the resonant frequency, but conversely is degraded in the loss in the frequency region higher than the anti-resonant frequency due to the spurious response generated around the operation band end of the reflectors.

In the ladder type filter, in the parallel resonators P1 to P3, the frequency at which the loss becomes worse overlaps the frequency side higher than the center of the filter passband. For this reason, if the SAW element 1 is used as the parallel resonators of the ladder type filter, according to certain designs, conversely the loss of the filter will sometimes become worse. Accordingly, in the ladder type filter, the pass characteristic can be remarkably improved while reducing a degradation of the filter characteristic by using the SAW element 1 in only a portion of the serial resonators. Note that, where design is carried out so as to prevent the anti-resonant frequency of the parallel resonators in the ladder type filter from entering the passband of the filter, the SAW element 1 can be used as the parallel resonators.

REFERENCE SIGNS LIST 1. acoustic wave element (SAW element)
2. piezoelectric substrate
　2A. upper surface
3. excitation electrode (IDT electrode)
　3a. main region
　3b. outer region
　　30. comb-shaped electrode
　　　30a. first comb-shaped electrode
　　　30b. second comb-shaped electrode
　　31. bus bar
　　　31a. first bus bar
　　　31b. second bus bar
　　32. electrode finger
　　　32a. first electrode finger
　　　32b. second electrode finger
　　300. changed part
Pt1. pitch
　Pt1a. first pitch
　Pt1b. second pitch
Gp. gap
　Gp1. first gap
　Gp2. second gap
4. reflector
　41. reflector bus bar
　42. reflector electrode finger
Pt2. pitch
5. protective layer
7. duplexer
8. antenna terminal
9. transmission terminal
10. reception terminal
11. transmission filter
12. receiving filter
15. conductive layer
17. multimode type SAW filter
18. auxiliary resonator
101. communication device
103. RF-IC
105. band pass filter
107. amplifier
109. antenna
111. amplifier
113. band pass filter
S1, S2, S3. serial resonators
P1, P2, P3. parallel resonators

The invention claimed is:

1. An acoustic wave element comprising:
a piezoelectric substrate;
an excitation electrode which is located on an upper surface of the piezoelectric substrate, comprises a plurality of electrode fingers, and generates an acoustic wave; and
two reflectors which are located on the upper surface of the piezoelectric substrate, comprise a plurality of reflector electrode fingers, and sandwich the excitation electrode in the propagation direction of the acoustic wave, wherein
the excitation electrode comprises
a main region located between the two end parts of the propagation direction of the acoustic wave and in which electrode finger design of the electrode fingers is uniform, and
two outer regions which are located on the two sides while sandwiching the main region therebetween and which extend from a part modified in the electrode finger design from that of the main region up to the end parts,
in the each of the reflectors, a resonant frequency determined according to electrode finger design of the reflector electrode fingers is lower than the resonant frequency determined according to the electrode finger design of the electrode fingers of the main region, and,
when an interval between the center of two adjacent electrode fingers in the main region is "a", the number of the electrode fingers configuring one of the outer regions is "m", and a distance between the center of the electrode finger which is located on the outmost edge of the main region and the center of the reflector electrode finger which is located on the innermost edge of the reflector is "x", $0.5 \times a \times (m+1) < x < a \times (m+1)$ is satisfied.

2. The acoustic wave element according to claim 1, wherein
the plurality of electrode fingers comprise a plurality of first electrode fingers and a plurality of second electrode fingers, and
the excitation electrode comprises
a first comb-shaped electrode comprising the plurality of first electrode fingers, and
a second comb-shaped electrode comprising the plurality of second electrode fingers which mesh with the plurality of first electrode fingers.

3. The acoustic wave element according to claim 1, wherein
the plurality of electrode fingers comprise;
a first edge electron finger located on the outmost edge of the main region, and
a second edge electron finger located on the innermost edge of the outer region, and is adjacent to the first edge electron finger,
a second gap between the first edge electron finger and the second edge electron finger is narrower than a first gap between two adjacent electrode fingers in the main region.

4. The acoustic wave element according to claim 3, wherein the second gap is 0.87 times or more to less than 1 time to the first gap.

5. The acoustic wave element according to claim 1, wherein the width of the electrode finger located on the innermost edge of the outer region is narrower than the width of the electrode finger in the main region.

6. The acoustic wave element according to claim 5, wherein the width of the electrode finger located on the innermost edge of the outer region is 0.877 times or more to less than 1 time to the width of the first electrode finger or second electrode finger in the main region.

7. The acoustic wave element according to claim 1, wherein, in the reflector, the interval between the center of two adjacent reflector electrode fingers is broader than the interval between the center of two adjacent electrode fingers in the main region.

8. The acoustic wave element according to claim 1, wherein the resonant frequency which is determined according to the electrode finger design of the electrode fingers of the outer region is higher than the resonant frequency which is determined according to the electrode finger design of the electrode fingers of the main region.

9. The acoustic wave element according to claim 8, wherein a first pitch which is the interval between the center of two adjacent electrode fingers in the outer region is narrower than a second pitch which is the interval between the center of two adjacent electrode fingers in the main region.

10. The acoustic wave element according to claim 9, wherein the first pitch of the excitation electrode is 0.986 times or more to less than 1 time to the second pitch.

11. The acoustic wave element according to claim 8, wherein, in the excitation electrode, the width of the electrode finger located in the outer region is narrower than the width of the electrode finger located in the main region.

12. The acoustic wave element according to claim 3, wherein the gap between two adjacent electrode fingers in an outer region is equal to the first gap.

13. A duplexer comprising:
an antenna terminal;
a transmission filter which filters a transmission signal and outputs the result to the antenna terminal; and
a receiving filter which filters a reception signal from the antenna terminal, wherein
the transmission filter or the receiving filter comprises the acoustic wave element according to claim 1.

14. The duplexer according to claim 13, wherein
the transmission filter comprises
serial resonators which are connected in series, and
parallel resonator which are connected in parallel with respect to the serial resonators, and
at least a portion of the serial resonators are configured by said acoustic wave elements.

15. The duplexer according to claim 13, wherein, in the transmission filter, only the serial resonators are configured by said acoustic wave elements.

16. A communication device comprising:
an antenna;
a duplexer according to claim 13 which is electrically connected to the antenna; and
an RF-IC which is electrically connected to the duplexer.

* * * * *